(12) United States Patent
Jang et al.

(10) Patent No.: US 12,230,658 B2
(45) Date of Patent: Feb. 18, 2025

(54) IMAGE SENSOR INCLUDING A SEPARATION STRUCTURE

(71) Applicant: SAMSUNG ELECTRONICS CO., LTD., Suwon-si (KR)

(72) Inventors: Min Ho Jang, Suwon-si (KR); Seung Kuk Kang, Seoul (KR); Hae Sung Jung, Suwon-si (KR); Kwan Sik Cho, Hwaseong-si (KR); Ho-Chul Ji, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 467 days.

(21) Appl. No.: 17/548,712

(22) Filed: Dec. 13, 2021

(65) Prior Publication Data
US 2022/0352216 A1    Nov. 3, 2022

(30) Foreign Application Priority Data

Apr. 30, 2021   (KR) .......................... 10-2021-0056359

(51) Int. Cl.
*H01L 27/146*   (2006.01)

(52) U.S. Cl.
CPC .... *H01L 27/1463* (2013.01); *H01L 27/14621* (2013.01); *H01L 27/14627* (2013.01); *H01L 27/14636* (2013.01); *H01L 27/1464* (2013.01); *H01L 27/14645* (2013.01); *H01L 27/14683* (2013.01)

(58) Field of Classification Search
CPC ........... H01L 27/1463; H01L 27/14621; H01L 27/14627; H01L 27/14636; H01L 27/1464; H01L 27/14645; H01L 27/14683; H01L 27/14612; H01L 27/14689; H01L 27/1469;
(Continued)

(56) References Cited

U.S. PATENT DOCUMENTS 7,977,718 B2 *   7/2011   Hannebauer ........ H01L 27/1464
                                          257/292
8,129,809 B2 *   3/2012   Jang .................... H01L 27/1464
                                          257/446
(Continued)

FOREIGN PATENT DOCUMENTS

KR   10-2020-0035821      4/2020

*Primary Examiner* — Kimberly N Rizkallah
*Assistant Examiner* — Pratiksha Jayant Lohakare
(74) *Attorney, Agent, or Firm* — F. CHAU & ASSOCIATES, LLC

(57) ABSTRACT

An image sensor includes a substrate having first and second surfaces and first and second regions. Unit pixels including photoelectric conversion layers are arranged inside the first region. A pixel separation pattern extends from the first surface to the second surface in the first region, separates each of the unit pixels, and includes a pixel separation spacer film and a pixel separation filling film. A dummy pixel separation pattern extends from the first surface to the second surface in the second region, and includes a dummy pixel separation filling film. A wiring structure disposed on the second surface includes an inter-wiring insulating film and a first wiring. A first contact directly connects the dummy pixel separation filling film and connects the dummy pixel separation filling film to the first wiring. A height of the pixel separation filling film is greater than a height of the dummy pixel separation filling film.

20 Claims, 26 Drawing Sheets

(58) Field of Classification Search
CPC ......... H01L 27/14623; H01L 27/14634; H01L 27/14603
USPC ...................................................... 257/292
See application file for complete search history.

(56) References Cited

U.S. PATENT DOCUMENTS

| | | | |
|---|---|---|---|
| 9,425,231 B2 | 8/2016 | Kim et al. | |
| 10,204,964 B1 | 2/2019 | Lee et al. | |
| 10,748,955 B2 | 8/2020 | Oh et al. | |
| 10,854,655 B2 | 12/2020 | Lee | |
| 2008/0083939 A1* | 4/2008 | Guidash | H01L 27/14634 257/292 |
| 2009/0302409 A1* | 12/2009 | Qian | H01L 27/14629 257/E31.001 |
| 2015/0255495 A1* | 9/2015 | Park | H01L 27/14621 257/446 |
| 2018/0047766 A1* | 2/2018 | Pyo | H01L 27/1463 |
| 2018/0197904 A1* | 7/2018 | Oh | H01L 27/1463 |
| 2018/0301509 A1* | 10/2018 | Ishii | H10K 39/32 |
| 2020/0227455 A1* | 7/2020 | Lee | H01L 27/14685 |
| 2020/0235148 A1 | 7/2020 | Shim | |
| 2020/0251658 A1* | 8/2020 | Eom | H10K 71/70 |
| 2020/0321376 A1 | 10/2020 | Noudo | |
| 2021/0335877 A1* | 10/2021 | Kim | H01L 27/14621 |
| 2022/0068981 A1* | 3/2022 | Jung | H01L 27/14685 |
| 2022/0190017 A1* | 6/2022 | Park | H01L 27/14645 |

\* cited by examiner

IMAGE SENSOR INCLUDING A SEPARATION STRUCTURE

CROSS-REFERENCE TO RELATED APPLICATION

This application claims priority under 35 U.S.C. § 119 to Korean Patent Application No. 10-2021-0056359, filed on Apr. 30, 2021 in the Korean Intellectual Property Office, the disclosure of which is incorporated by reference in its entirety herein.

1. TECHNICAL FIELD

The present inventive concept relates to an image sensor.

2. DISCUSSION OF RELATED ART

An image sensor is a semiconductor device that converts optical information into an electric signal. Image sensors may include a charge coupled device (CCD) image sensor, and a complementary metal-oxide semiconductor (CMOS) image sensor.

The image sensor may be configured in the form of a package. The package may protect the image sensor and allow light to enter a photo receiving surface or a sensing area of the image sensor.

Recently, a backside illumination (BSI) image sensor has been researched in which incident light is radiated through a back side of a semiconductor substrate so that pixels formed in the image sensor have increased light-receiving efficiency and light sensitivity.

SUMMARY

Aspects of the present inventive concept provide an image sensor having increased quality and productivity.

However, aspects of the present inventive concept are not limited to the ones set forth herein. The above and other aspects of the present inventive concept will become more apparent to one of ordinary skill in the art to which the present inventive concept pertains by referencing the detailed description of embodiments given below.

According to an aspect of the present inventive concept, an image sensor includes a substrate having a first surface and a second surface opposite to each other, and includes a first region and a second region disposed around the first region. A plurality of unit pixels is arranged inside the first region of the substrate. Each of the plurality of unit pixels includes a photoelectric conversion layer. A pixel separation pattern extends from the first surface of the substrate to the second surface of the substrate in the first region of the substrate, separates each of the plurality of unit pixels, and includes a pixel separation spacer film and a pixel separation filling film. The pixel separation spacer film defines a pixel separation recess. The pixel separation pattern fills a portion of the pixel separation recess. A dummy pixel separation pattern extends from the first surface of the substrate to the second surface of the substrate in the second region of the substrate, and includes a dummy pixel separation spacer film that defines a dummy pixel separation recess, and a dummy pixel separation filling film that fills at least a portion of the dummy pixel separation recess. A wiring structure is disposed on the second surface of the substrate and includes an inter-wiring insulating film and a first wiring in the inter-wiring insulating film. A color filter is disposed on the second surface of the substrate. A first contact is directly connected to the dummy pixel separation filling film and connects the dummy pixel separation filling film to the first wiring. A height from the first surface of the substrate to a bottom surface of the pixel separation filling film is greater than a height from the first surface of the substrate to a bottom surface of the dummy pixel separation filling film.

According to an aspect of the present inventive concept, an image sensor includes a substrate having a first surface and a second surface opposite to each other, and includes a first region and a second region disposed around the first region. A separation structure extends from the first surface of the substrate to the second surface of the substrate and has a grid shape. The separation structure includes a separation spacer film and a separation filling film. The separation spacer film defines a separation recess. The separation filling film fills at least a portion of the separation recess. A plurality of unit pixels is arranged inside the first region of the substrate. Each of the plurality of unit pixels includes a photoelectric conversion layer that is disposed in the substrate. A wiring structure is disposed on the first surface of the substrate and includes an inter-wiring insulating film and a wiring in the inter-wiring insulating film. A microlens is disposed on the second surface of the substrate in the first region of the substrate. A pad is disposed on the wiring structure and is connected to the wiring. A contact is disposed in the second region of the substrate. The contact is directly connected to the separation filling film and connects the separation filling film and the wiring. A height from the first surface of the substrate to a bottom surface of the separation filling film in the first region of the substrate is greater than a height from the first surface of the substrate to the bottom surface of the separation filling film in the second region of the substrate.

According to an aspect of the present inventive concept, an image sensor includes a substrate that includes a first surface and a second surface opposite to each other, and includes a first region and a second region disposed around the first region. A plurality of unit pixels is arranged inside the first region of the substrate. Each of the plurality of unit pixels includes a photoelectric conversion layer. A pixel separation pattern extends from the first surface of the substrate to the second surface of the substrate in the first region of the substrate. The pixel separation pattern separates each of the unit pixels, and includes a pixel separation spacer film that defines a pixel separation recess and a pixel separation filling film that fills a portion of the pixel separation recess. A dummy pixel separation pattern extends from the first surface of the substrate to the second surface of the substrate in the second region of the substrate. The dummy pixel separation pattern includes a dummy pixel separation spacer film that defines a dummy pixel separation recess and a dummy pixel separation filling film that fills at least a portion of the dummy pixel separation recess. A wiring structure is disposed on the first surface of the substrate and includes an inter-wiring insulating film and a wiring in the inter-wiring insulating film. A color filter is disposed on the second surface of the substrate. A pad is disposed on the wiring structure and is connected to the wiring. A first connection pattern is connected to a lower surface of the pad. A second connection pattern is disposed on a lower surface of the first connection pattern. The second connection pattern is connected to the first connection pattern. A contact is directly connected to the dummy pixel separation filling film and connects the dummy pixel separation filling film and the wiring. A height from the first surface of the substrate to a bottom surface of the pixel separation filling film is greater than a height from the first surface of the substrate to a bottom surface of the dummy pixel separation filling film.

BRIEF DESCRIPTION OF THE DRAWINGS

The above and other aspects and features of the present inventive concept will become more apparent by describing in detail embodiments thereof with reference to the attached drawings, in which.

DETAILED DESCRIPTION OF EMBODIMENTS

Hereinafter, an image sensor according to some embodiments of the present inventive concept will be described referring to FIGS. 1A to 12.

Figure 1A:
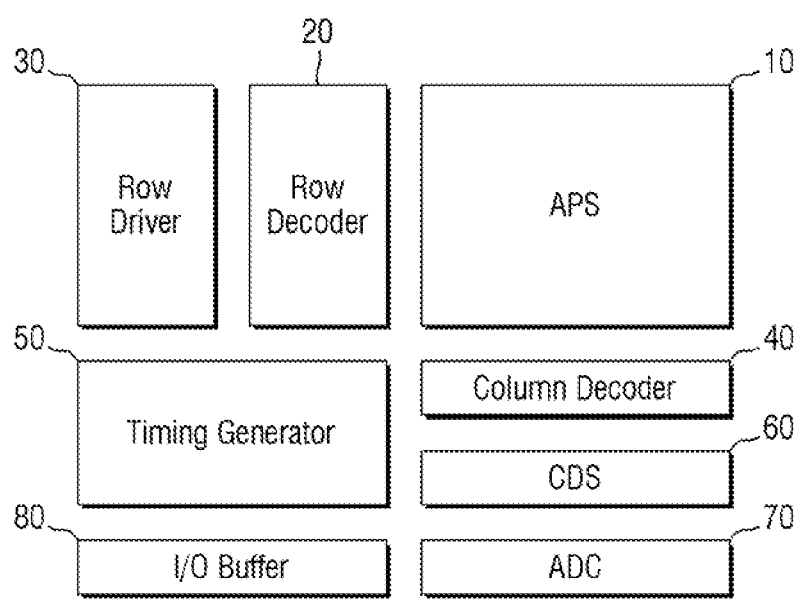
FIG. 1A is a block diagram for explaining an image sensor according to an embodiment of the present inventive concept.
Figure 1B:
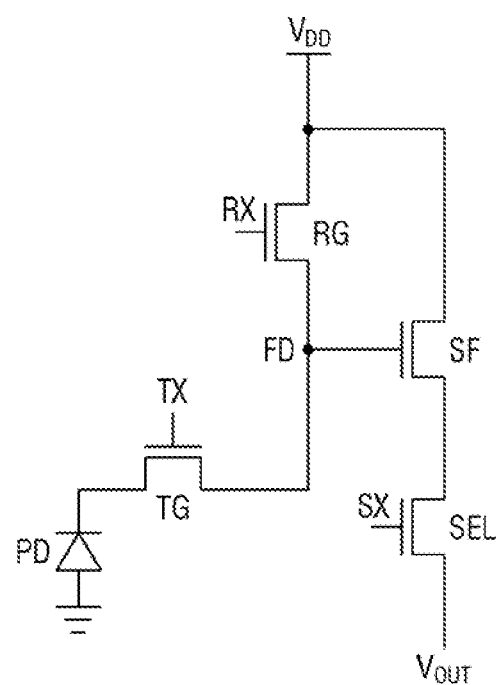
FIG. 1B is a circuit diagram for explaining a unit pixel of the image sensor according to an embodiment of the present inventive concept.

FIG. 1A is a block diagram for explaining an image sensor according to some embodiments. FIG. 1B is a circuit diagram for explaining a unit pixel of the image sensor according to some embodiments.

Referring to FIG. 1A, the image sensor according to some embodiments includes an active pixel sensor array (APS) 10, a row decoder 20, a row driver 30, a column decoder 40, a timing generator 50, a correlated double sampler (CDS) 60, an analog-to-digital converter (ADS) 70, and an I/O buffer 80.

The active pixel sensor array 10 includes a plurality of unit pixels arranged two-dimensionally, and may convert an optical signal into an electric signal. The active pixel sensor array 10 may be driven by a plurality of drive signals, such as a pixel selection signal, a reset signal and a charge transfer signal, from the row driver 30. Also, the electrical signal converted by the active pixel sensor array 10 may be provided to the correlated double sampler 60.

The row driver 30 may provide a large number of drive signals for driving a plurality of unit pixels to the active pixel sensor array 10 depending on the results decoded by the row decoder 20. In an embodiment in which the unit pixels are arranged in the form of a matrix, the drive signals may be provided for each row. However, embodiments of the present inventive concept are not limited thereto.

The timing generator 50 may provide a timing signal and a control signal to the row decoder 20 and the column decoder 40.

The correlated double sampler (CDS) 60 may receive, hold and sample the electrical signals generated by the active pixel sensor array 10. The correlated double sampler 60 may doubly sample a specific noise level and a signal level due to an electrical signal, and output a difference level corresponding to a difference between the noise level and the signal level.

The analog-to-digital converter (ADC) 70 may convert the analog signal corresponding to the difference level, which is output from the correlated double sampler 60, into a digital signal and output the digital signal.

The I/O buffer 80 latches the digital signal, and the latched signal may sequentially output the digital signal to a video signal processing unit depending on the decoding result from the column decoder 40.

Referring to FIG. 1B, each unit pixel may include a photoelectric conversion layer PD, a transfer transistor TG, a floating diffusion region FD, a reset transistor RG, a source follower transistor SF, and a selection transistor SEL.

The photoelectric conversion element PD may generate electric charges in proportion to an amount of light incident from the outside. The photoelectric conversion element PD may be coupled with the transfer transistor TG, which transmits the generated and accumulated electric charges to the floating diffusion region FD. Since the floating diffusion region FD is a region in which the electric charges are converted into a voltage, and has a parasitic capacitance, the electric charges may be accumulatively stored therein.

A first end of the transfer transistor TG may be connected to the photoelectric conversion element PD, and the opposite second end of the transfer transistor TG may be connected to the floating diffusion region FD. The transfer transistor TG may be formed by a transistor that is driven by a predetermined bias (e.g., a transfer signal TX). For example, the transfer transistor TG may transmit the electric charges, which are generated from the photoelectric conversion element PD, to the floating diffusion region FD in accordance with the transfer signal TX.

The source follower transistor SF may amplify a change in the electrical potential of the floating diffusion region FD to which the electric charges are sent from the photoelectric conversion element PD and output it to an output line $V_{OUT}$. When the source follower transistor SF is turned on, a predetermined electrical potential provided to a drain of the source follower transistor SF, for example, a power supply voltage $V_{DD}$, may be sent to a drain region of the selection transistor SEL.

The selection transistor SEL may select a unit pixel to be read on a row basis. The selection transistor SEL may be made up of a transistor that is driven by a selection line that applies a predetermined bias (e.g., a row selection signal SX).

The reset transistor RG may periodically reset the floating diffusion region FD. The reset transistor RG may be made up of a transistor that is driven by a reset line that applies a predetermined bias (e.g., a reset signal RX). When the reset transistor RG is turned on by the reset signal RX, a predetermined electrical potential provided to the drain of the reset transistor RG, for example, a power supply voltage V)), may be sent to the floating diffusion region FD.

Figure 2:
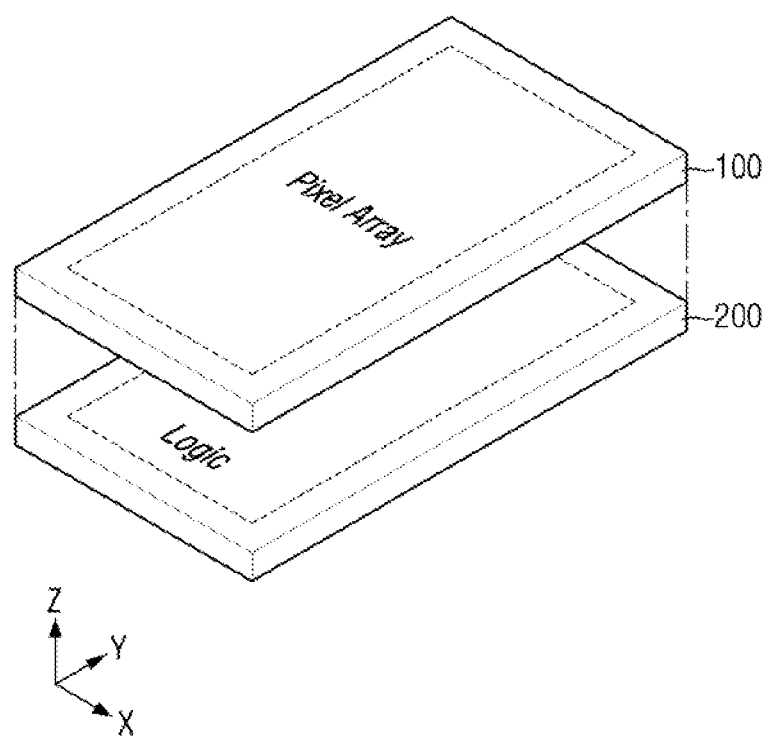
FIG. 2 is a diagram showing a conceptual layout of the image sensor according to an embodiment of the present inventive concept.

FIG. 2 is a diagram showing a conceptual layout of the image sensor according to an embodiment of the present inventive concept.

Referring to FIG. 2, the image sensor according to some embodiments may include a first substrate structure 100 and a second substrate structure 200 that are stacked.

In an embodiment, in the first substrate structure 100, a plurality of unit pixels may be arranged in a two-dimensional array structure in a plane defined in a first direction X and a second direction Y. For example, the first substrate structure 100 may include a pixel array. The first direction X and the second direction Y may be perpendicular to each other.

The second substrate structure 200 may include a logic region, or the like. The second substrate structure 200 may be positioned below the first substrate structure 100. The first substrate structure 100 and the second substrate structure 200 may be electrically connected to each other. The second substrate structure 200 may allow the pixel signal sent from the first substrate structure 100 to be sent to the logic region of the second substrate structure 200.

Logic elements may be disposed in the logic region of the second substrate structure 200. The logic elements may include circuits for processing the pixel signal received from the unit pixels.

The first substrate structure 100 and the second substrate structure 200 may be stacked in a third direction Z. In an embodiment, the third direction Z may be a direction that is perpendicular to the first direction X and the second direction Y. However, embodiments of the present inventive concept are not limited thereto and the first to third directions X, Y, Z may cross each other at various different angles.

Figure 3:
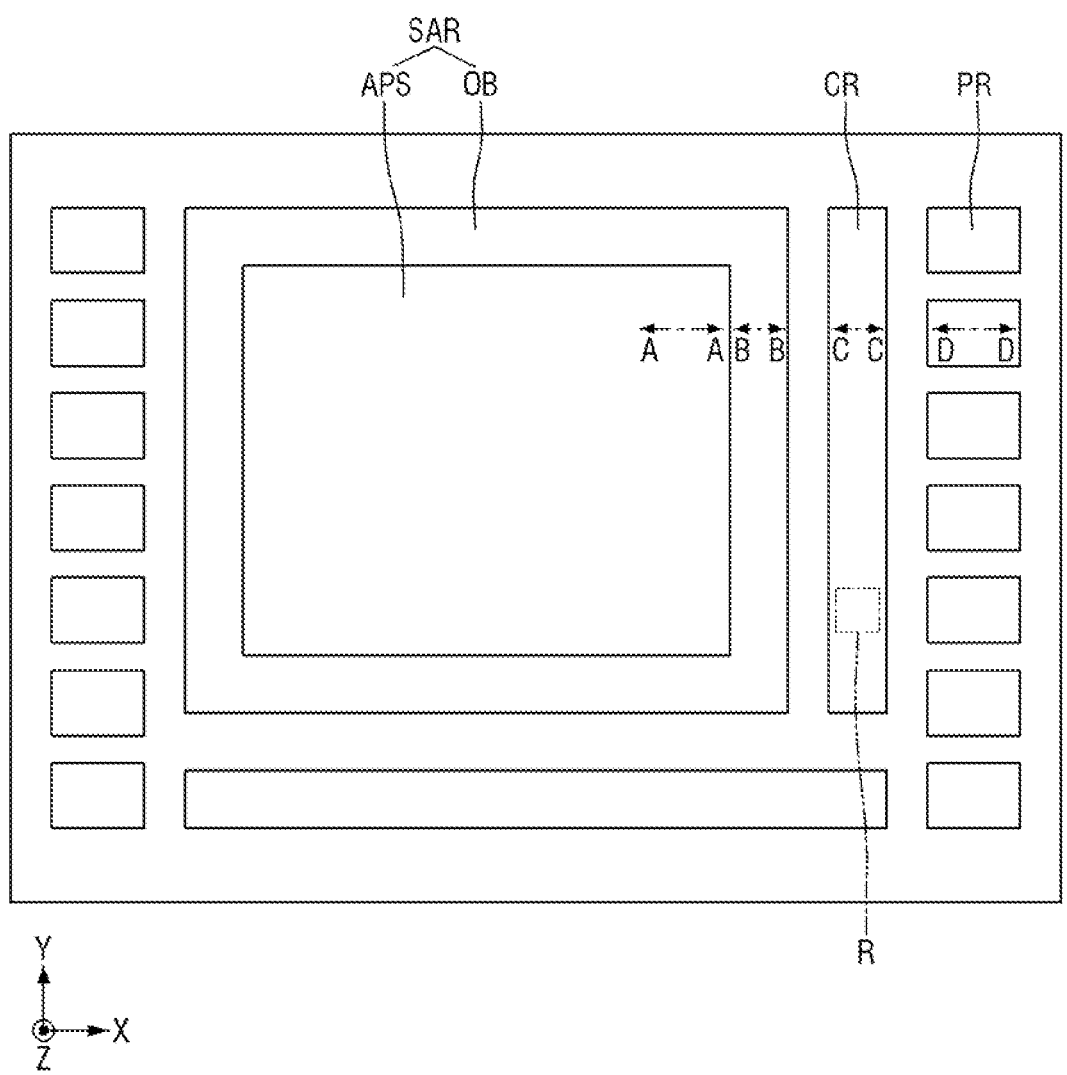
FIG. 3 is a layout diagram for explaining the image sensor according to an embodiment of the present inventive concept.

FIG. 3 is a layout diagram for explaining the image sensor according to an embodiment of the present inventive concept.

Referring to FIG. 3, the image sensor according to some embodiments may include a sensor array region SAR, a connecting region CR, and a pad region PR.

The sensor array region SAR may include a region corresponding to the active pixel sensor array 10 of FIG. 1A. For example, a plurality of unit pixels arranged two-dimensionally (e.g., in the form of a matrix) in a plane defined in the first direction X and the second direction Y extend may be disposed in the sensor array region SAR.

The sensor array region SAR may include a light-receiving region APS and a light-shielding region OB. Active pixels that receive light and generate an active signal may be arranged inside the light-receiving region APS. Optical black pixels that shield light to generate an optical black signal may be arranged in the light-shielding region OB. Although the light-shielding region OB may be disposed, for example, along the periphery of the light-receiving region APS, this is merely an example and the arrangement of the light-shielding region OB may vary.

In some embodiments, dummy pixels may be disposed in the light-receiving region APS adjacent to the light-shielding region OB.

The connecting region CR may be disposed around the sensor array region SAR. Although the connecting region CR may be disposed on one side of the sensor array region SAR, this is merely an example and the connecting region CR may be disposed on two or more sides of the sensor array region SAR in some embodiments. Wirings are disposed in the connecting region CR, and may be configured to transmit and receive electrical signals of the sensor array region SAR.

The pad region PR may be arranged around the sensor array region SAR. Although the pad region PR may be disposed to be adjacent to the edge of the image sensor according to some embodiments, this is merely an example and the pad region PR may be arranged in various different positions. In an embodiment, the pad region PR is connected to an external device or the like, and may be configured to transmit and receive electrical signals between the image sensor and the external device.

In some embodiments, the sensor array region SAR may be a first region, and the connecting region CR and the pad region PR may be a second region. For example, the second region may be arranged around the first region (e.g., in the first and/or second directions X, Y). However, embodiments of the present inventive concept are not limited thereto.

Figure 4:
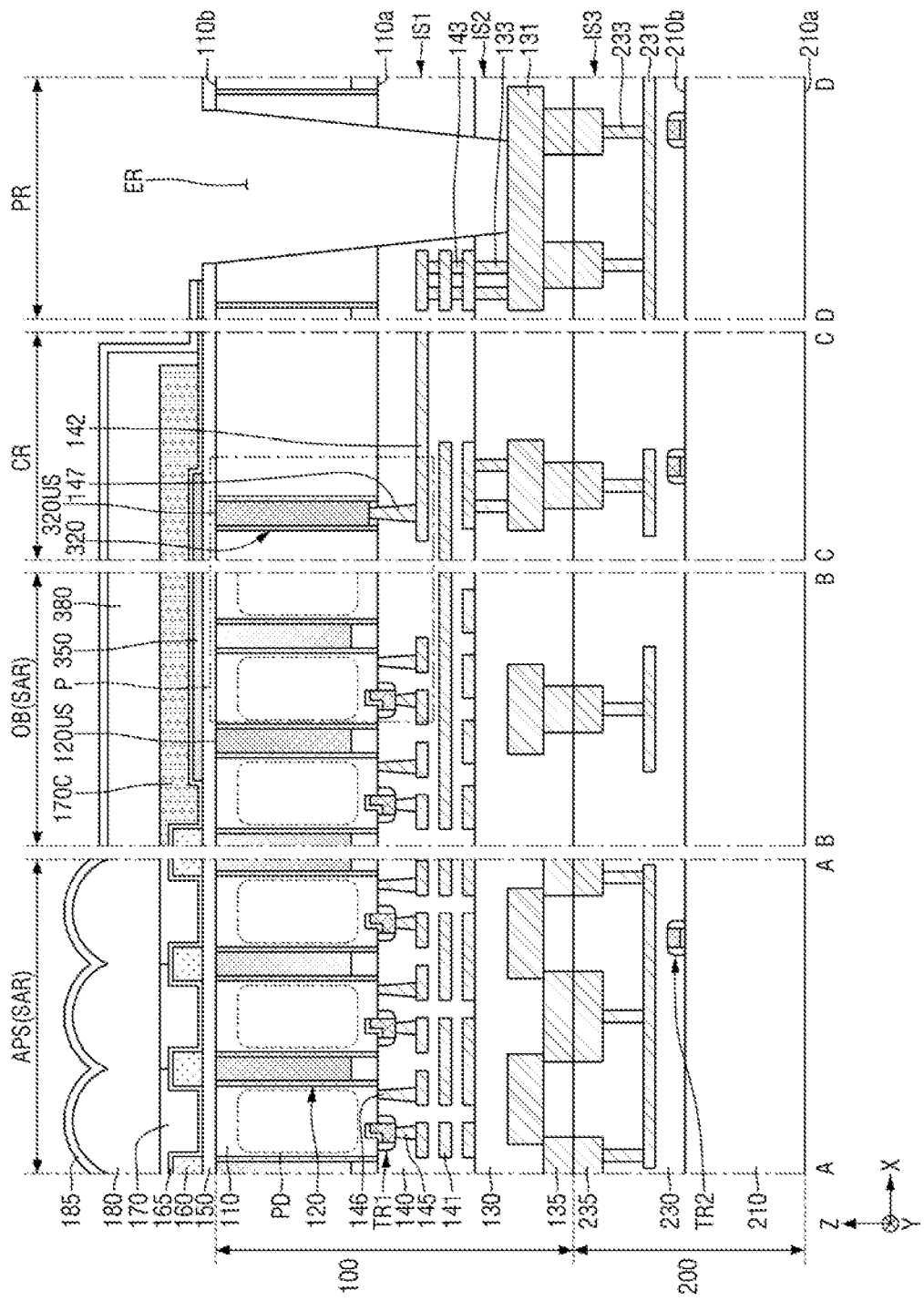
FIG. 4 is a cross-sectional view taken along A-A, B-B, C-C and D-D of FIG. 3 according to embodiments of the present inventive concept.

FIG. 4 is a cross-sectional view taken along A-A, B-B, C-C and D-D of FIG. 3.

Referring to FIG. 4, the image sensor according to some embodiments may include a first substrate 110, a pixel separation pattern 120, a dummy pixel separation pattern 320, a first wiring structure IS1, a second wiring structure IS2, a second substrate 210, a third wiring structure IS3, a surface insulating film 150, a first color filter 170, a grid pattern 160, a microlens 180, and a pad 131.

In an embodiment, the first substrate 110 may be a semiconductor substrate. For example, the first substrate 110 may be bulk silicon or SOI (silicon-on-insulator). The first substrate 110 may be a silicon substrate or may include other substances, for example, silicon germanium, indium antimonide, lead tellurium compounds, indium arsenic, indium phosphide, gallium arsenide or gallium antimonide. However, embodiments of the present inventive concept are not limited thereto. For example, in an embodiment, the first substrate 110 may have an epitaxial layer disposed on a base substrate.

The first substrate 110 may include a first surface 110a and a second surface 110b that are opposite to each other (e.g., in the third direction Z). In embodiments to be described below, the first surface 110a may be referred to as a front side of the first substrate 110, and the second surface 110b may be referred to as a back side of the first substrate 110. In some embodiments, the second surface 110b of the first substrate 110 may be a light-receiving surface on which light is incident. For example, the image sensor according to some embodiments may be a backside illumination (BSI) image sensor.

A plurality of unit pixels may be disposed on the first substrate 110 of the sensor array region SAR. For example, a plurality of pixels arranged two-dimensionally (e.g., in the form of a matrix) in a plane defined in the first direction X and the second direction Y may be disposed in the light-receiving region APS.

Each unit pixel may include a photoelectric conversion layer PD. In an embodiment, the photoelectric conversion layer PD may be disposed inside the first substrate 110 of the light-receiving region APS and the light-shielding region OB. The photoelectric conversion layer PD may generate electric charges in proportion to an amount of light that is incident from the outside. In some embodiments, a dummy photoelectric conversion layer may be disposed inside a portion of the light-shielding region OB. For example, the photoelectric conversion layer PD disposed in the light-shielding region OB may be an active photoelectric conversion layer, and may be a dummy photoelectric conversion layer. However, embodiments of the present inventive concept are not limited thereto.

In an embodiment, a dummy photoelectric conversion layer may also be disposed inside the first substrate 110 of the connecting region CR. The dummy pixel separation pattern 320 of the connecting region CR may separate the dummy pixels. The dummy pixels may include a dummy photoelectric conversion layer. However, embodiments of the present inventive concept are not limited thereto.

In an embodiment, the photoelectric conversion layer PD may include, for example, at least one element selected from a photo diode, a photo transistor, a photo gate, a pinned photo diode, an organic photo diode, a quantum dot, and a combination thereof. However, embodiments of the present inventive concept are not limited thereto.

Each unit pixel may include a first electronic element TR1. In some embodiments, the first electronic element TR1 may be disposed on the first surface 110a of a first substrate 110 (e.g., disposed directly thereon in the third direction Z). The first electronic element TR1 may be connected to the photoelectric conversion layer PD to form various transistors for processing electric signals. For example, the first electronic element TR1 may constitute a transistor such as the transfer transistor TG, the reset transistor RG, the source follower transistor SF or the selection transistor SEL described above in the description of FIG. 1B.

In some embodiments, the first electronic element TR1 may include a vertical transfer transistor. For example, the first electronic element TR1 constituting the transfer transistor TG described above may partially extend into the first substrate 110. Such a transfer transistor TG may reduce an area of the unit pixel to enable a high integration of the image sensor.

The pixel separation pattern 120 may be disposed inside the first substrate 110 of the sensor array region SAR. The dummy pixel separation pattern 320 may be disposed inside the first substrate 110 of the connecting region CR. In an embodiment, the pixel separation pattern 120 and the dummy pixel separation pattern 320 may be disposed, for example, by embedding an insulating substance in a deep trench formed by patterning the first substrate 110. However, embodiments of the present inventive concept are not limited thereto.

In some embodiments, an upper surface 120US of the pixel separation pattern 120 and an upper surface 320US of the dummy pixel separation pattern 320 may be positioned on the same plane (e.g., in the third direction Z). For example, a height from the first surface 110a of the first substrate 110 to the upper surface 120US of the pixel separation pattern 120 is the same as a height from the first surface 110a of the first substrate 110 to the upper surface 320US of the dummy pixel separation pattern 320. The description related to the pixel separation pattern 120 and the dummy pixel separation pattern 320 will be provided in detail below referring to FIG. 5.

The first wiring structure IS1 may be disposed on the first substrate 110. For example, the first wiring structure IS1 may cover the first surface 110a of the first substrate 110. The second wiring structure IS2 may be disposed on the first wiring structure IS1 (e.g., disposed directly thereon in the third direction Z). The first wiring structure IS1 may be positioned between the first substrate 110 and the second wiring structure IS2 (e.g., in the third direction Z). For example, the upper surface of the first wiring structure IS1 may be in direct contact with the first surface 110a of the first substrate 110. A lower surface of first wiring structure 151 may be in direct contact with the upper surface of the second wiring structure IS2. The first substrate 110, the first wiring structure IS1, and the second wiring structure IS2 may form the first substrate structure 100.

The first wiring structure IS1 may be made up of one or more wirings. For example, the first wiring structure IS1 may include a first inter-wiring insulating film 140, and a plurality of wirings 132 and 134 and a plurality of contacts 143, 145, 146 and 147 inside the first inter-wiring insulating film 140. In FIG. 4, the number of layers of the wiring constituting the first wiring structure IS1 and the arrangement thereof are merely examples and embodiments of the present inventive concept are not limited thereto. In an embodiment, the first inter-wiring insulating film 140 may include, but is not limited to, for example, at least one compound selected from silicon oxide, silicon nitride, silicon oxynitride, and a low dielectric constant (low-k) substance having a lower dielectric constant than silicon oxide.

In some embodiments, the first wiring structure IS1 may include a first wiring 141 in the sensor array region SAR, and a second wiring 142 in the connecting region CR. The first wiring 141 may be electrically connected to a unit pixel of the sensor array region SAR. For example, the first wiring 141 may be connected to the first electronic element TR1. The second wiring 142 may extend from the sensor array region SAR. For example, the second wiring 142 may be electrically connected to at least a portion of the first wiring 141. Therefore, the second wiring 142 may be electrically connected to the unit pixel of the sensor array region SAR.

In some embodiments, the first wiring structure IS1 may include a first contact 145 and a second contact 146 in the sensor array region SAR, a third contact 147 in the connecting region CR, and a fourth contact 143 in the pad region PR. The first contact 145 may be connected to the first electronic element TR1. The second contact 146 may be connected to the first substrate 110. The second contact 146 may be connected to the source/drain region. The third contact 147 may be connected to the second wiring 142 and the dummy pixel separation pattern 320. For example, the third contact 147 may be directly connected to the second wiring 142 and the dummy pixel separation pattern 320 to connect (e.g., electrically connect) the dummy pixel separation pattern 320 to the first wiring structure IS1. The fourth contact 143 may be connected to the pad 131.

In some embodiments, a ground voltage or a negative voltage may be applied to the dummy pixel separation pattern 320, using the third contact 147. Accordingly, an ESD (electrostatic discharge) bruise defect of the image sensor according to some embodiments may be prevented. Here, the ESD bruise defect means a phenomenon in which the electric charges generated by ESD or the like are accumulated on the surface of the substrate (e.g., the first surface 110a) to cause a bruise-like defect on the image to be generated.

In an embodiment, the first wiring 141 and the second wiring 142 may include, but are not limited to, for example, at least one compound selected from tungsten (W), copper (Cu), aluminum (Al), gold (Au), silver (Ag), and alloys thereof.

In an embodiment, the first contact 145, the second contact 146, the third contact 147 and the fourth contact 143 may include, but are not limited to, at least one compound selected from tungsten (W), copper (Cu), aluminum (Al), gold (Au), silver (Ag), and alloys thereof.

In an embodiment, the second wiring structure IS2 may include a second inter-wiring insulating film 130, a pad 131 in the second inter-wiring insulating film 130, a first connection pattern 135, and a plurality of contacts. In FIG. 4, the number of layers of the wirings constituting the second wiring structure IS2 and the arrangements thereof are merely an example and embodiments of the present inventive concept are not limited thereto. In an embodiment, the second inter-wiring insulating film 130 may include, but is not limited to, for example, at least one compound selected from silicon oxide, silicon nitride, silicon oxynitride, and a low dielectric constant (low-k) substance having a lower dielectric constant than silicon oxide.

The pad 131 may be disposed on the first wiring structure IS1 and positioned inside the second inter-wiring insulating film 130. For example, the pad 131 may be formed by being embedded in the second inter-wiring insulating film 130. In an embodiment, the pad 131 may include, but is not limited to, for example, at least one compound selected from tungsten (W), copper (Cu), aluminum (Al), gold (Au), silver (Ag), and alloys thereof.

A fifth contact 133 may connect the pad 131 to a plurality of wirings of the first wiring structure IS1. For example, the pad 131, the fifth contact 133, the second wiring 142, and the third contact 147 may be electrically connected to each other. In an embodiment, the fifth contact 133 may include, but is not limited to, for example, at least one compound selected from tungsten (W), copper (Cu), aluminum (Al), gold (Au), silver (Ag), and alloys thereof.

The first connection pattern 135 may be disposed on the lower surface of the pad 131 and an upper surface of the first connection pattern 135 may directly contact the lower surface of the pad 131. The first connection pattern 135 may be electrically connected to the pad 131. A portion of the first connection pattern 135 may be exposed from the surface of the second inter-wiring insulating film 130. A portion of the first connection pattern 135 may be exposed from the surface of the third inter-wiring insulating film 230.

For example, a portion of the first connection pattern 135 may be exposed from the lower surface of the second inter-wiring insulating film 130. A portion of the first connection pattern 135 may be exposed from the upper surface of the third inter-wiring insulating film 230.

The first connection pattern 135 may be electrically connected to a second connection pattern 235 in the third inter-wiring insulating film 230. In an embodiment, the first connection pattern 135 may have various columnar shapes such as a cylindrical shape, a conical shape, a polygonal column shape, and polygonal pyramid shape. However, embodiments of the present inventive concept are not limited thereto.

The first connection pattern 135 may include a conductive substance. In an embodiment, the first connection pattern 135 may include, but is not limited to, for example, copper (Cu).

In an embodiment, the second substrate 210 may be bulk silicon or SOI (silicon-on-insulator). The second substrate 210 may be a silicon substrate or may include other substances, for example, silicon germanium, indium antimonide, lead tellurium compounds, indium arsenic, indium phosphide, gallium arsenide or gallium antimonide. However, embodiments of the present inventive concept are not limited thereto. For example, in an embodiment, the second substrate 210 may have an epitaxial layer formed on the base substrate.

The second substrate 210 may include a third surface 210a and a fourth surface 210b that are opposite to each other (e.g., in the third direction Z). In some embodiments, the fourth surface 210b of the second substrate 210 may be a surface that faces the second surface 110b of the first substrate 110.

A plurality of electronic elements may be disposed on the second substrate 210. For example, a second electronic element TR2 may be disposed on the fourth surface 210b of the second substrate 210 (e.g., disposed directly thereon in the third direction Z). The second electronic element TR2 may be electrically connected to the sensor array region SAR to transmit and receive electrical signals to and from each unit pixel of the sensor array region SAR. For example, in an embodiment, the second electronic element TR2 may include electronic elements that constitute the row decoder 20, the row driver 30, the column decoder 40, the timing generator 50, the correlated double sampler 60, the analog-to-digital converter 70 and/or the I/O buffer 80 of FIG. 1A. However, embodiments of the present inventive concept are not limited thereto.

The third wiring structure IS3 may be disposed on the second substrate 210 (e.g., disposed directly thereon in the third direction Z). For example, the second wiring structure IS2 may cover the fourth surface 210b of the second substrate 210. The second substrate 210 and the third wiring structure IS3 may form the second substrate structure 200.

The third wiring structure IS3 may be attached to the second wiring structure IS2. For example, the upper surface of the third wiring structure IS3 may be directly attached to the bottom surface of the second wiring structure IS2.

The third wiring structure IS3 may include one or multiple wirings, a plurality of contacts, and the second connection pattern 235. The third wiring structure IS3 may include a third inter-wiring insulating film 230, a third wiring 231, a sixth contact 233, and a second connection pattern 235.

In FIG. 4, the number of layers of wirings constituting the third wiring structure IS3 and the arrangement thereof are merely an example, and embodiments of the present inventive concept are not limited thereto. In an embodiment, the third inter-wiring insulating film 230 may include, but is not limited to, for example, at least one compound selected from silicon oxide, silicon nitride, silicon oxynitride, and a low dielectric constant (low-k) substance having a lower dielectric constant than silicon oxide. In some embodiments, the third wiring structure IS3 may also include the same substance as the first wiring structure IS1 and the second wiring structure IS2.

The second connection pattern 235 may be disposed on a lower surface of the first connection pattern 135. For example, an upper surface of the second connection pattern 235 may be directly connected to a lower surface of the first connection pattern 135. The second connection pattern 235 may be electrically connected to the first connection pattern 135. The second connection pattern 235 may be exposed from the surface of the second inter-wiring insulating film 130. A portion of the second connection pattern 235 may be exposed from the surface of the third inter-wiring insulating film 230.

For example, the second connection pattern 235 may be exposed from a lower surface of the second inter-wiring insulating film 130. An upper surface of the second connection pattern 235 may be exposed from an upper surface of the third inter-wiring insulating film 230. The second connection pattern 235 may be electrically connected to the first connection pattern 135 inside the second inter-wiring insulating film 130. In an embodiment, the second connection pattern 235 may have various columnar shapes such as a cylindrical shape, a conical shape, a polygonal column shape, and polygonal pyramid shape. However, embodiments of the present inventive concept are not limited thereto.

The second connection pattern 235 may include a conductive substance. For example, the second connection pattern 235 may include, but is not limited to, for example, copper (Cu).

The third wiring 231 may be connected to the second connection pattern 235 through the sixth contact 233. The third wiring 231 may be connected to the pad 131, using the second connection pattern 235 and the sixth contact 233.

In an embodiment, the third wiring 231 may include, for example, at least one compound selected from tungsten (W), copper (Cu), aluminum (Al), gold (Au), silver (Ag), and alloys thereof. However, embodiments of the present inventive concept are not limited thereto.

In an embodiment, the sixth contact 233 may include, for example, at least one compound selected from tungsten (W), copper (Cu), aluminum (Al), gold (Au), silver (Ag), and alloys thereof. However, embodiments of the present inventive concept are not limited thereto.

The surface insulating film 150 may be disposed on the second surface 110b of the first substrate 110. The surface insulating film 150 may extend along the second surface 110b of the first substrate 110. In some embodiments, at least a portion of the surface insulating film 150 may be in direct contact with the pixel separation pattern 120 and the dummy pixel separation pattern 320. For example, a portion of the lower surface of the surface insulating film 150 may directly contact an upper surface of the pixel separation pattern 120 and the dummy pixel separation pattern 320.

The surface insulating film 150 may include an insulating substance. For example, in an embodiment, the surface insulating film 150 may include at least one compound selected from silicon oxide, silicon nitride, silicon oxynitride, aluminum oxide, hafnium oxide, and a combination thereof. However, embodiments of the present inventive concept are not limited thereto.

The surface insulating film 150 may function as an antireflection film to prevent the reflection of light incident on the first substrate 110, thereby increasing the light-receiving rate of the photoelectric conversion layer PD. Further, the surface insulating film 150 may function as a flattening film to form a first color filter 170 and a microlens 180, which will be described later, at a uniform height.

The first color filter 170 may be disposed on the surface insulating film 150 of the light-receiving region APS. In some embodiments, the first color filters 170 may be arranged to correspond to each unit pixel. For example, a plurality of first color filters 170 may be arranged two-dimensionally (e.g., in the form of a matrix) in the plane defined in the first direction X and the second direction Y.

The first color filter 170 may have various color filters depending on the unit pixel. For example, the first color filter 170 may be arranged in a Bayer pattern that includes a red color filter, a green color filter, and a blue color filter. However, embodiments of the present inventive concept are not limited thereto and the colors of the color filters may vary. For example, in an embodiment, the first color filter 170 may include a yellow filter, a magenta filter and a cyan filter, and may further include a white filter.

A grid pattern 160 may be disposed on the surface insulating film 150 (e.g., disposed directly thereon in the third direction Z). The grid pattern 160 may be formed in a grid shape from a planar viewpoint (e.g., in a plane defined in the first and second directions X, Y), and may be interposed between the plurality of first color filters 170.

In an embodiment, the grid pattern 160 may include a low refractive index substance having a lower refractive index than silicon (Si). For example, the grid pattern 160 may include at least one compound selected from silicon oxide, aluminum oxide, tantalum oxide, and a combination thereof. However, embodiments of the present inventive concept are not limited thereto. The grid pattern 160 including the low refractive index substance may increase the quality of the image sensor, by refracting or reflecting the light which is obliquely incident on the image sensor.

In some embodiments, a first protective film 165 may be disposed on the surface insulating film 150 and the grid pattern 160. The first protective film 165 may be interposed between the surface insulating film 150 and the first color filter 170, and between the grid pattern 160 and the first color filter 170 (e.g., in the third direction Z). For example, the first protective film 165 may extend along the profiles of the upper surface of the surface insulating film 150, and the lateral side surfaces and upper surface of the grid pattern 160.

In an embodiment, the first protective film 165 may include, for example, aluminum oxide. However, embodiments of the present inventive concept are not limited thereto. The first protective film 165 may prevent damage to the surface insulating film 150 and the grid pattern 160.

The microlens 180 may be disposed on the first color filter 170. The microlens 180 may be arranged to correspond to each unit pixel. For example, the microlens 180 may be arranged two-dimensionally (e.g., in the form of a matrix) in a plane defined in the first direction X and the second direction Y. In an embodiment, the microlens 180 may not be disposed in the second region, such as the connecting region CR and the pad region PR.

The microlens 180 has a convex shape and may have a predetermined radius of curvature. Accordingly, the microlens 180 may concentrate the light which is incident on the photoelectric conversion layer PD. In an embodiment, the microlens 180 may include, for example, a light-transmitting resin. However, embodiments of the present inventive concept are not limited thereto.

In some embodiments, a second protective film 185 may be disposed on the microlens 180. The second protective film 185 may extend along the surface of the microlens 180. The second protective film 185 may include, for example, an inorganic oxide film. For example, the second protective film 185 may include at least one compound selected from silicon oxide, titanium oxide, zirconium oxide, hafnium oxide, and a combination thereof. However, embodiments of the present inventive concept are not limited thereto. In some embodiments, the second protective film 185 may include a low temperature oxide (LTO).

The second protective film 185 may protect the microlens 180 from the outside. For example, the second protective film 185 may protect the microlens 180 including an organic substance, by including an inorganic oxide film. Also, the second protective film 185 may increase the light concentration capability of the microlens 180. For example, the second protective film 185 may reduce reflection, refraction, scattering, or the like of incident light that reaches the space between the microlenses 180, by filling the space between the microlenses 180.

The image sensor according to some embodiments may further include a first connecting structure 350.

The first connecting structure 350 may be disposed inside the light-shielding region OB. The first connecting structure 350 may also be disposed inside the connecting region CR. The first connecting structure 350 may be positioned to overlap the pixel separation pattern 120 inside the light-shielding region OB in the third direction Z. The first connecting structure 350 may be positioned to overlap the dummy pixel separation pattern 320 inside the connecting region CR in the third direction Z. The first connecting structure 350 may serve to block light that is incident on the light-shielding region OB or the connecting region CR.

The first connecting structure 350 may be disposed on the surface insulating film 150. The first connecting structure 350 may not be in direct contact with the pixel separation pattern 120 and the dummy pixel separation pattern 320.

In an embodiment, the first connecting structure 350 may include, for example, at least one compound selected from a titanium (Ti) film, a titanium nitride (TiN) film, a tungsten (W) film, and a combination film thereof. However, embodiments of the present inventive concept are not limited thereto.

In some embodiments, a second color filter 170C may be disposed on the second surface 110b of the first substrate 110 in the light-shielding region OB and the connecting region CR. The second color filter 170C may cover the first connecting structure 350. The second color filter 170C may be disposed to cover a portion of the first protective film 165 positioned inside the light-shielding region OB and the connecting region CR. In an embodiment, the second color filter 170C may include, for example, a blue color filter. However, embodiments of the present inventive concept are not limited thereto.

In some embodiments, a third protective film 380 may be disposed on the second color filter 170C. For example, the third protective film 380 may be disposed to cover a portion of the first protective film 165 positioned in the light-shielding region OB and the connecting region CR. In some embodiments, the second protective film 185 may extend along the surface of the third protective film 380. In an embodiment, the third protective film 380 may include, but is not limited to, for example, a light-transmitting resin. In some embodiments, the third protective film 380 may include the same substance as the microlens 180.

The pad 131 may be embedded inside the second inter-wiring insulating film 130. In some embodiments, the surface of the pad 131 may be exposed. The pad 131 may be exposed by an exposure opening ER which penetrates the surface insulating film 150, the first substrate 110, the first inter-wiring insulating film 140, and a portion of the second inter-wiring insulating film 130. Therefore, the pad 131 may be configured to be connected to an external device or the like to transmit and receive electrical signals between the image sensor and the external device according to some embodiments.

Figure 5:
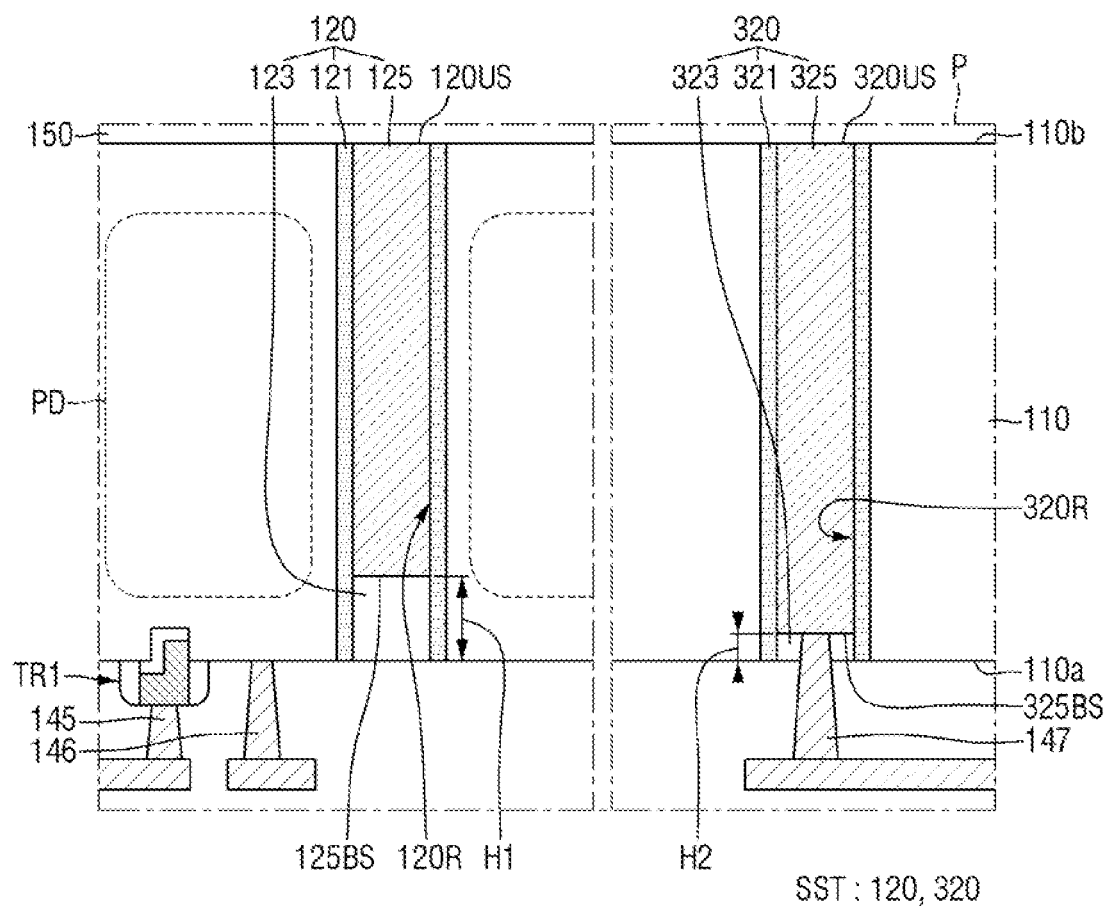
FIG. 5 is an enlarged view of a region P of FIG. 4 according to an embodiment of the present inventive concept.

FIG. 5 is an enlarged view of a region P of FIG. 4. A separation structure SST, that is, the pixel separation pattern 120 and the dummy pixel separation pattern 320 will be described in more detail using FIG. 5.

Referring to FIGS. 4 and 5, the separation structure SST may be disposed inside the first substrate 110. The plurality of separation structures SST may extend from the second surface 110b of the first substrate 110 to the first surface 110a in the third direction Z. The separation structures SST may each be spaced apart from each other in the first direction X.

The separation structures SST may include, for example, a pixel separation pattern 120 and a dummy pixel separation pattern 320. The pixel separation pattern 120 may be disposed inside the sensor array region SAR of the first substrate 110. The dummy pixel separation pattern 320 may be disposed inside the connecting region CR of the first substrate 110.

The separation structure SST may include a separation spacer film SSL, a separation filling film SFL, and a separation capping film SCL. The separation spacer film SSL and the surface insulating film 150 may define a separation recess SR. In an embodiment, the separation filling film SFL may fill a portion of the separation recess SR. The separation capping film SCL may fill the portion of the separation recess SR that is not filled by the separation filling film SFL.

The separation spacer film SSL may include, for example, a pixel separation spacer film 121 and a dummy pixel separation spacer film 321. The separation filling film SFL may include a pixel separation filling film 125 and a dummy pixel separation filling film 325. The separation capping film SCL may include a pixel separation capping film 123 and a dummy pixel separation capping film 323. However, embodiments of the present inventive concept are not limited thereto.

The separation structure SST may define a plurality of unit pixels. The separation structure SST may have a grid shape from a planar viewpoint (e.g., in a plane defined in the first and second directions X, Y). The separation structure SST may separate a plurality of unit pixels.

The pixel separation pattern 120 may be disposed inside the first substrate 110 of the sensor array region SAR. In an embodiment, the pixel separation pattern 120 may be formed, for example, by embedding an insulating substance in a deep trench formed by patterning the first substrate 110. However, embodiments of the present inventive concept are not limited thereto.

The pixel separation pattern 120 may define a plurality of unit pixels. In an embodiment, the pixel separation pattern 120 is formed in a grid shape from a planar viewpoint, and may separate a plurality of pixels from each other.

In some embodiments, the pixel separation pattern 120 may penetrate the first substrate 110. For example, the pixel separation pattern 120 may fully penetrate the first substrate 110 in the third direction Z and may extend from the first surface 10a to the second surface 110b.

In some embodiments, the pixel separation pattern 120 may include a pixel separation spacer film 121, a pixel separation filling film 125, and a pixel separation capping film 123. A pixel separation spacer film 121 may be disposed in the first substrate 110. The pixel separation spacer film 121 and the surface insulating film 150 may define a pixel separation recess 120R. The pixel separation filling film 125 may fill a portion of the pixel separation recess 120R. The pixel separation capping film 123 may fill the portion of the pixel separation recess 120R that is not filled by the pixel separation filling film 125.

In some embodiments, the pixel separation spacer film 121 may include an oxide film having a lower refractive index than the first substrate 110. For example, the pixel separation spacer film 121 may include at least one compound selected from silicon oxide, aluminum oxide, tantalum oxide, and combinations thereof. However, embodiments of the present inventive concept are not limited thereto.

The pixel separation spacer film 121, which has a lower refractive index than the first substrate 110, may refract or reflect light which is obliquely incident on the photoelectric conversion layer PD. Also, the pixel separation spacer film 121 may prevent the photoelectric charges generated in a specific unit pixel due to the incident light from moving to the adjacent unit pixel by a random drift. For example, the pixel separation spacer film 121 may increase the light-receiving rate of the photoelectric conversion layer PD to increase the quality of the image sensor according to some embodiments.

In some embodiments, the pixel separation filling film 125 may include a conductive substance. For example, in an embodiment, the pixel separation filling film 125 may include polysilicon (poly Si). However, embodiments of the present inventive concept are not limited thereto. In some embodiments, a ground voltage or a negative voltage may be applied to the pixel separation filling film 125 including the conductive substance. Therefore, it is possible to effectively prevent an ESD (electrostatic discharge) bruise defect of the image sensor according to some embodiments. Here, the ESD bruise defect means a phenomenon in which the electric charges generated by ESD or the like are accumulated on the surface of the substrate (e.g., the first surface 110$a$) to cause a bruise-like defect on the image to be generated.

In some embodiments, the pixel separation capping film 123 may include an insulating substance. For example, in an embodiment, the pixel separation capping film 123 may include an oxidation-based insulating substance. However, embodiments of the present inventive concept are not limited thereto.

The dummy pixel separation pattern 320 may be disposed in the first substrate 110 of the connecting region OB. In an embodiment, the dummy pixel separation pattern 320 may be formed, for example, by embedding an insulating substance in a deep trench formed by patterning the first substrate 110. However, embodiments of the present inventive concept are not limited thereto.

The dummy pixel separation pattern 320 may define a plurality of unit pixels. In an embodiment, the dummy pixel separation pattern 320 may be formed in a grid shape from a planar viewpoint (e.g., in a plane defined in the first and second directions D1, D2), and may separate a plurality of pixels from each other.

In some embodiments, the dummy pixel separation pattern 320 may penetrate the first substrate 110. For example, the dummy pixel separation pattern 320 may fully penetrate the first substrate 110 (e.g., in the third direction Z) and may extend from the first surface 110$a$ to the second surface 110$b$.

In some embodiments, the dummy pixel separation pattern 320 may include a dummy pixel separation spacer film 321, a dummy pixel separation filling film 325, and a dummy pixel separation capping film 323. For example, a dummy pixel separation spacer film 321 may be disposed in the first substrate 110. The dummy pixel separation spacer film 321 and the surface insulating film 150 may define a dummy pixel separation recess 320R. The dummy pixel separation filling film 325 may fill a portion of the dummy pixel separation recess 320R. The dummy pixel separation capping film 323 may fill a portion of the dummy pixel separation recess 320R that is not filled by the dummy pixel separation filling film 325.

Description of the substances included in the dummy pixel separation spacer film 321, the dummy pixel separation filling film 325, and the dummy pixel separation capping film 323 may be the same as description of the substance included in the pixel separation spacer film 121, the pixel separation filling film 125, and the pixel separation capping film 123 and a repeated description of similar or identical elements may be omitted for convenience of explanation.

In some embodiments, a vertical depth of the pixel separation capping film 123 is greater than a vertical depth of the dummy pixel separation capping film 323. For example, a height H1 (e.g., length in the third direction Z) from the first surface 110$a$ of the first substrate 110 to a bottom surface 125BS of the pixel separation filling film 125 is greater than a height H2 (e.g., length in the third direction Z) from the first surface 110$a$ of the first substrate 110 to a bottom surface 325BS of the dummy pixel separation filling film 325.

As the depth of the dummy pixel separation capping film 323 becomes shallower, the first contact 145, the second contact 146, and the third contact 147 may be formed at the same level. The term "same level" means formation by the same manufacturing process.

In some embodiments, the upper surface 120US of the pixel separation pattern 120 may be positioned at the same plane as the upper surface 320US of the dummy pixel separation pattern 32. For example, the height (e.g., length in the third direction Z) from the first surface 110$a$ of the first substrate 110 to the upper surface 120US of the pixel separation pattern 120 may be the same as a height (e.g., length in the third direction Z) from the first surface 110$a$ of the first substrate 110 to the upper surface 320US of the dummy pixel separation pattern 320.

Since the third contact 147 is connected to the lower surface of the dummy pixel separation filling film 325, another connecting structure may not be disposed on the upper surface 320US of the dummy pixel separation pattern 320.

Figure 6:
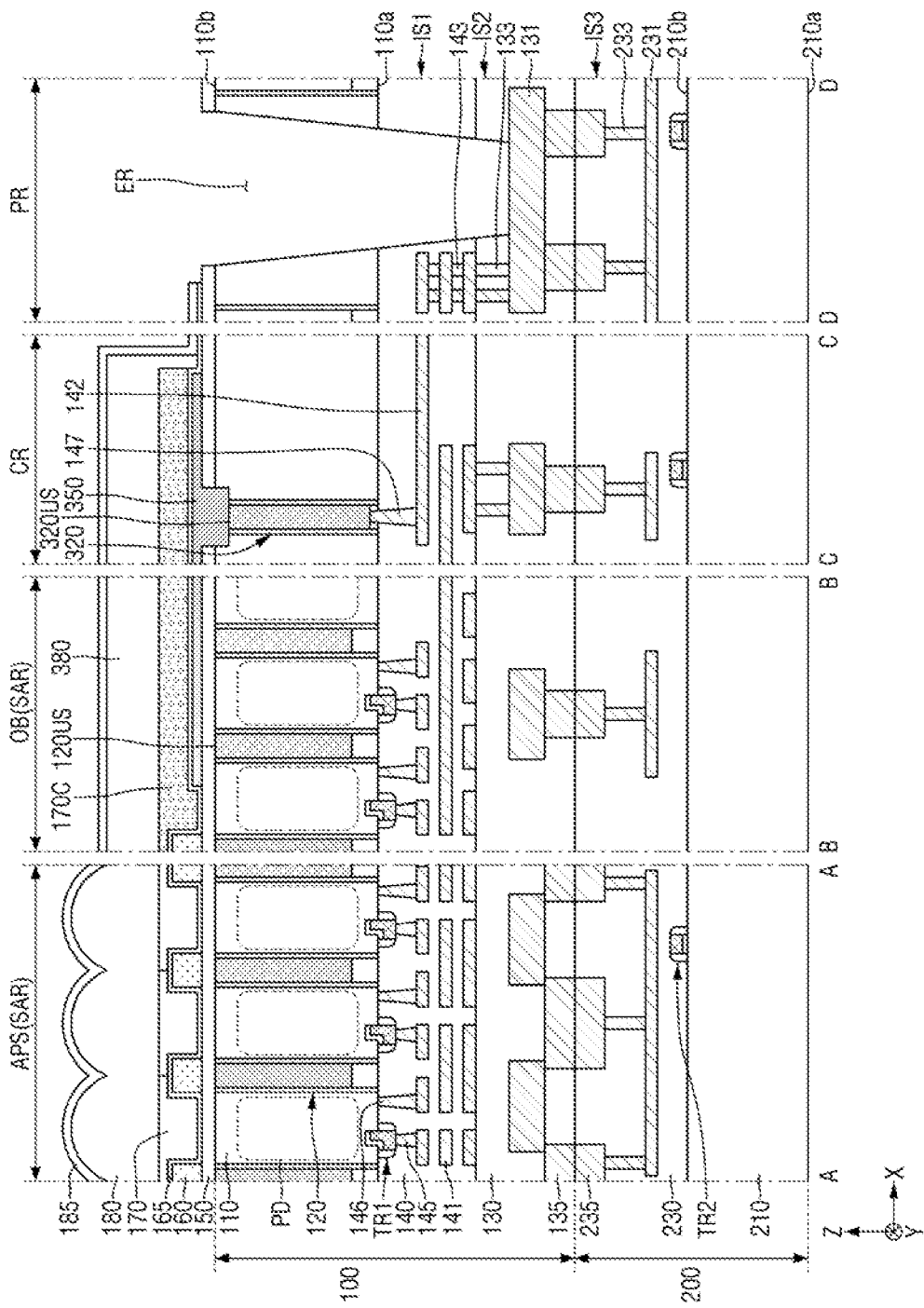
FIG. 6 is a cross-sectional view taken along A-A, B-B, C-C and D-D of FIG. 3 according to embodiments of the present inventive concept.

FIG. 6 is an exemplary diagram for explaining an image sensor according to some embodiments. For convenience of explanation, points different from those described using FIGS. 4 and 5 will be mainly described and a repeated description of similar or identical elements shown in FIGS. 4 and 5 may be omitted for convenience of explanation.

Referring to FIG. 6, the first connecting structure 350 may be directly connected to the dummy pixel separation pattern 320.

The first connecting structure 350 may be disposed on the pixel separation pattern 120, the dummy pixel separation pattern 320, and the surface insulating film 150 in the connecting region CR and the light-shielding region OB. The first connecting structure 350 may be electrically connected to the dummy pixel separation pattern 320 to apply a ground voltage or a negative voltage to the dummy pixel separation pattern 320. Accordingly, the electric charges generated by ESD or the like may be discharged to the first connecting structure 350 through the dummy pixel separation pattern 320, and ESD bruising defects may be effectively prevented.

The upper surface 120US of the pixel separation pattern 120 may be positioned higher than the upper surface of the dummy pixel separation pattern 320. For example, the height from the first surface 110$a$ of the first substrate 110 to the upper surface 120US of the pixel separation pattern 120 (e.g., in the third direction Z) may be greater than the height from the first surface 110$a$ of the first substrate 110 to the upper surface 320US of the dummy pixel separation pattern 320 (e.g., in the third direction Z).

Figure 7:
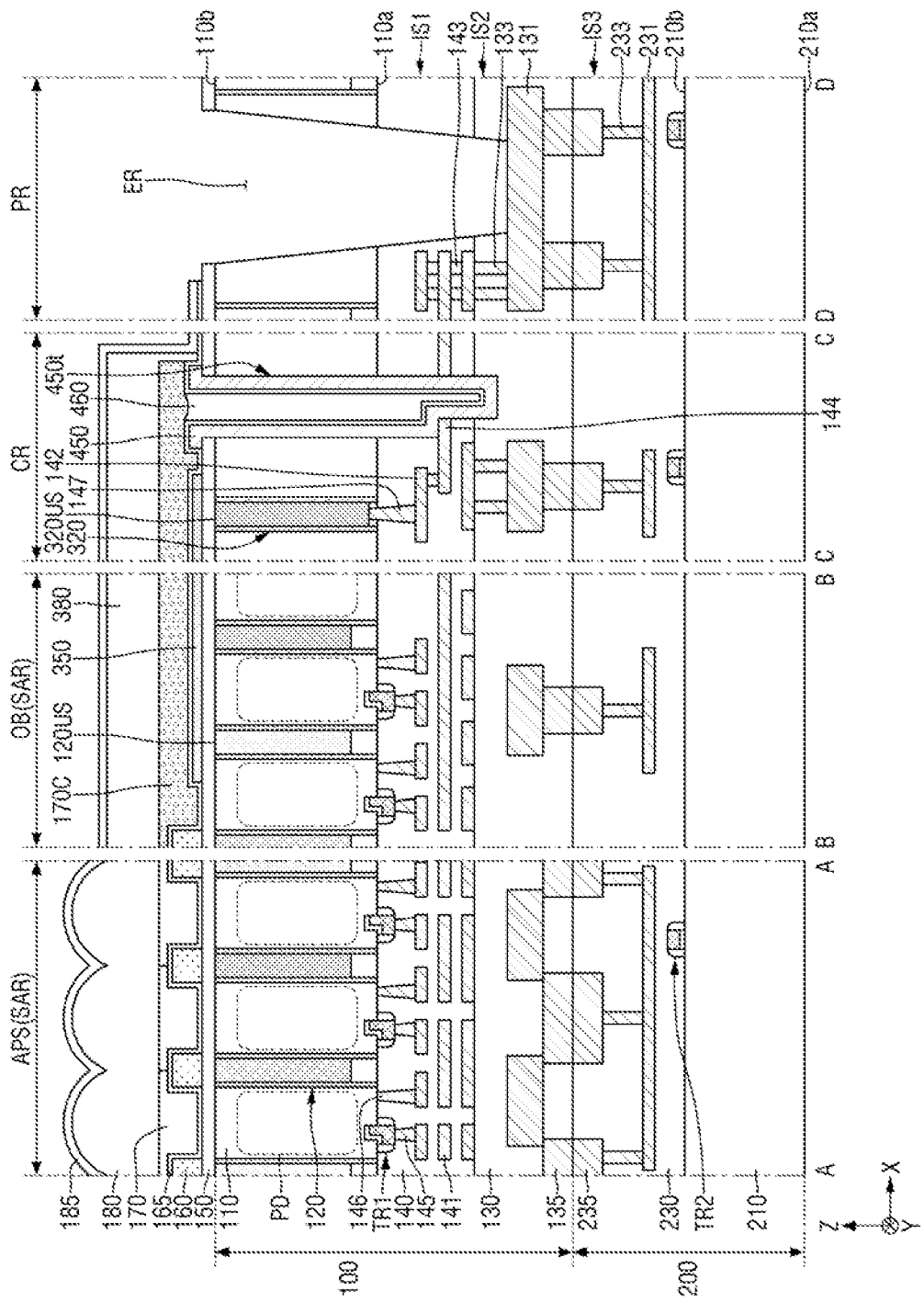
FIG. 7 is a cross-sectional view taken along A-A, B-B, C-C and D-D of FIG. 3 according to embodiments of the present inventive concept.

FIG. 7 is an exemplary diagram for explaining an image sensor according to some embodiments. For convenience of explanation, points different from those described using FIGS. 4 and 5 will be mainly described and a repeated description of similar or identical elements may be omitted for convenience of explanation.

Referring to FIG. 7, the image sensor according to some embodiments may further include a second connecting structure 450.

The second connecting structure 450 may be disposed inside the connecting region CR. The second connecting structure 450 may be disposed on the surface insulating film 150 of the connecting region CR. The second connecting structure 450 may electrically connect the first substrate structure 100 and the second substrate structure 200.

For example, a first trench 450t that penetrates the first substrate 110 of the connecting region CR and the first inter-wiring insulating film 140 may be formed. The first trench 450t may expose a fourth wiring 144. The second connecting structure 450 is formed in the first trench 450t and may be connected to the fourth wiring 144. In some embodiments, the second connecting structure 450 may extend along profiles of the lateral side surfaces and bottom surface of the first trench 450t.

In some embodiments, the second connecting structure 450 may be connected (e.g., electrically connected) to the pad 131 through the fourth wiring 144, a fourth contact 143, and a fifth contact 133. Further, the second connecting structure 450 may be connected to the dummy pixel separation pattern 320 through the fourth wiring 144 and the third contact 147. For example, the dummy pixel separation pattern 320, the second connecting structure 450, and the pad 131 may be electrically connected to each other.

In an embodiment, the second connecting structure 450 may include, for example, at least one compound selected from a titanium (Ti) film, a titanium nitride (TiN) film, a tungsten (W) film, and a combination film thereof. However, embodiments of the present inventive concept are not limited thereto.

In some embodiments, the first protective film 165 may cover the second connecting structure 450. For example, the first protective film 165 may extend along the profile of the second connecting structure 450.

In some embodiments, a first filling insulating film 460 that fills the first trench 450t may be formed on the second connecting structure 450. In an embodiment, the first filling insulating film 460 may include, for example, at least one compound selected from silicon oxide, aluminum oxide, tantalum oxide, and a combination thereof. However, embodiments of the present inventive concept are not limited thereto.

Figure 8:
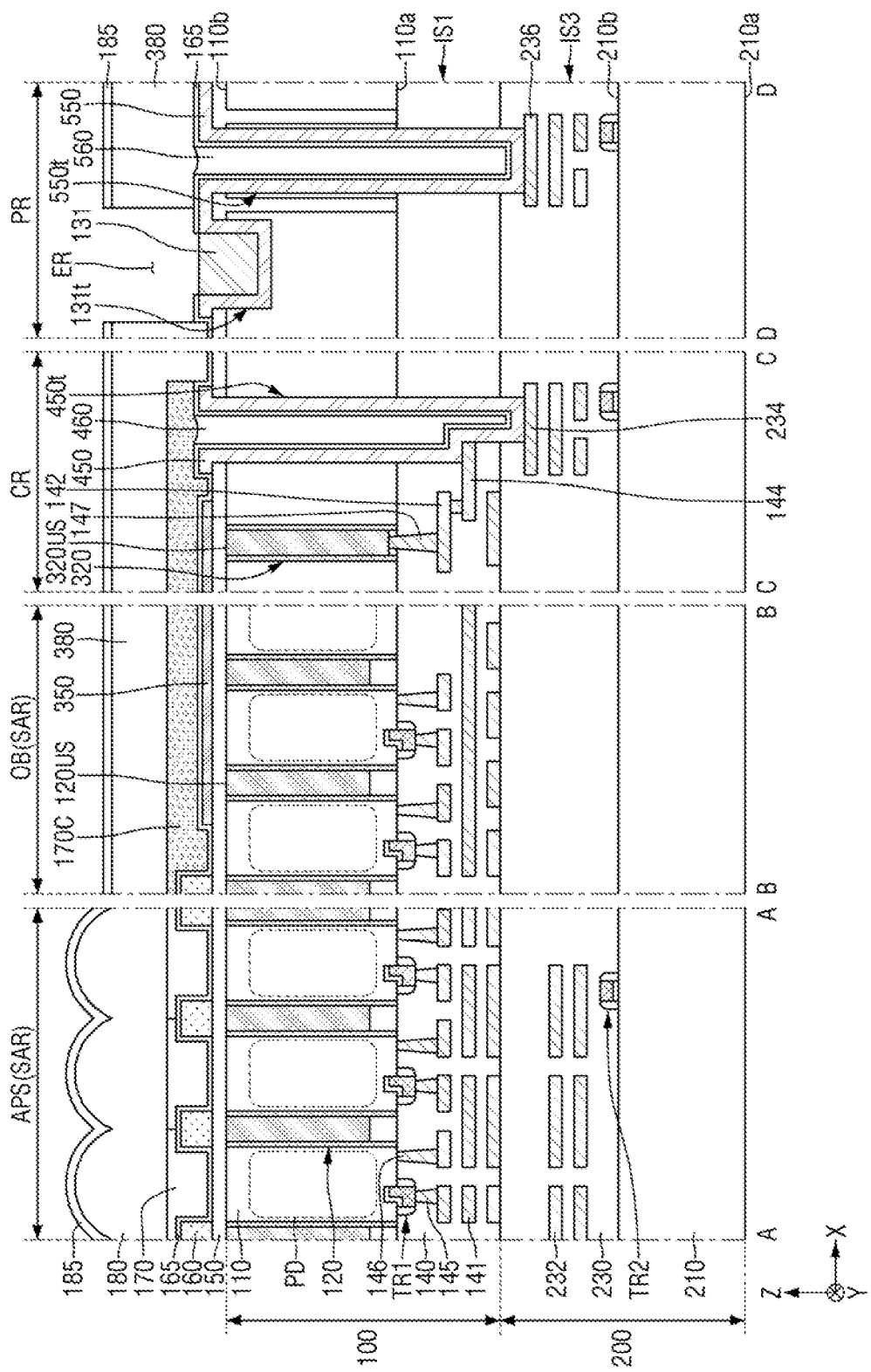
FIG. 8 is a cross-sectional view taken along A-A, B-B, C-C and D-D of FIG. 3 according to embodiments of the present inventive concept.

FIG. 8 is an exemplary diagram for explaining an image sensor according to some embodiments. For convenience of explanation, points different from those described using FIGS. 4, 5 and 7 will be mainly described and a repeated description of similar or identical elements may be omitted for convenience of explanation.

Referring to FIG. 8, the pad 131 is not disposed by being embedded in the inter-wiring insulating film. The image sensor according to some embodiments may further include a third connecting structure 550. The image sensor according to some embodiments may not include a second wiring structure IS2.

The third connecting structure 550 may be disposed inside the pad region PR. The third connecting structure 550 may be disposed on the surface insulating film 150 of the pad region PR. The third connecting structure 550 may electrically connect the second substrate structure 200 to an external device or the like.

For example, in an embodiment, a second trench 550t that extends fully through the first substrate structure 100 and a portion of the second substrate structure 200 may be formed in the pad region PR. The third connecting structure 550 is disposed in the second trench 550t and may be in direct contact with the fifth wiring 236.

Further, a pad trench 131t may be formed in the first substrate 110 of the pad region PR. The third connecting structure 550 may be disposed in the pad trench 131t and may be exposed. In some embodiments, the third connecting structure 550 may extend along the profiles of the lateral side surfaces and bottom surfaces of the second trench 550t and the pad trench 131t.

In some embodiments, a second filling insulating film 560 that fills the second trench 550t may be formed on the third connecting structure 550. In an embodiment, the second filling insulating film 560 may include for example, at least one compound selected from silicon oxide, aluminum oxide, tantalum oxide, and a combination thereof. However, embodiments of the present inventive concept are not limited thereto.

The pad 131 may be disposed on the third connecting structure 550. The pad 131 may fill the pad trench 131t after filling the third connecting structure 550.

The second connecting structure 450 may be connected to the sixth wiring 234 positioned inside the third wiring structure IS3. The fifth wiring 236 and the sixth wiring 234 may be connected to each other (e.g., electrically connected to each other). The pad 131, the third connecting structure 550, the second connecting structure 450, and the dummy pixel separation pattern may be electrically connected accordingly.

In some embodiments, a seventh wiring 232 may be disposed inside the third inter-wiring insulating film 230 of the sensor array region SAR. The seventh wiring 232 may be connected to the fifth wiring 236 and the sixth wiring 234.

Figure 9:
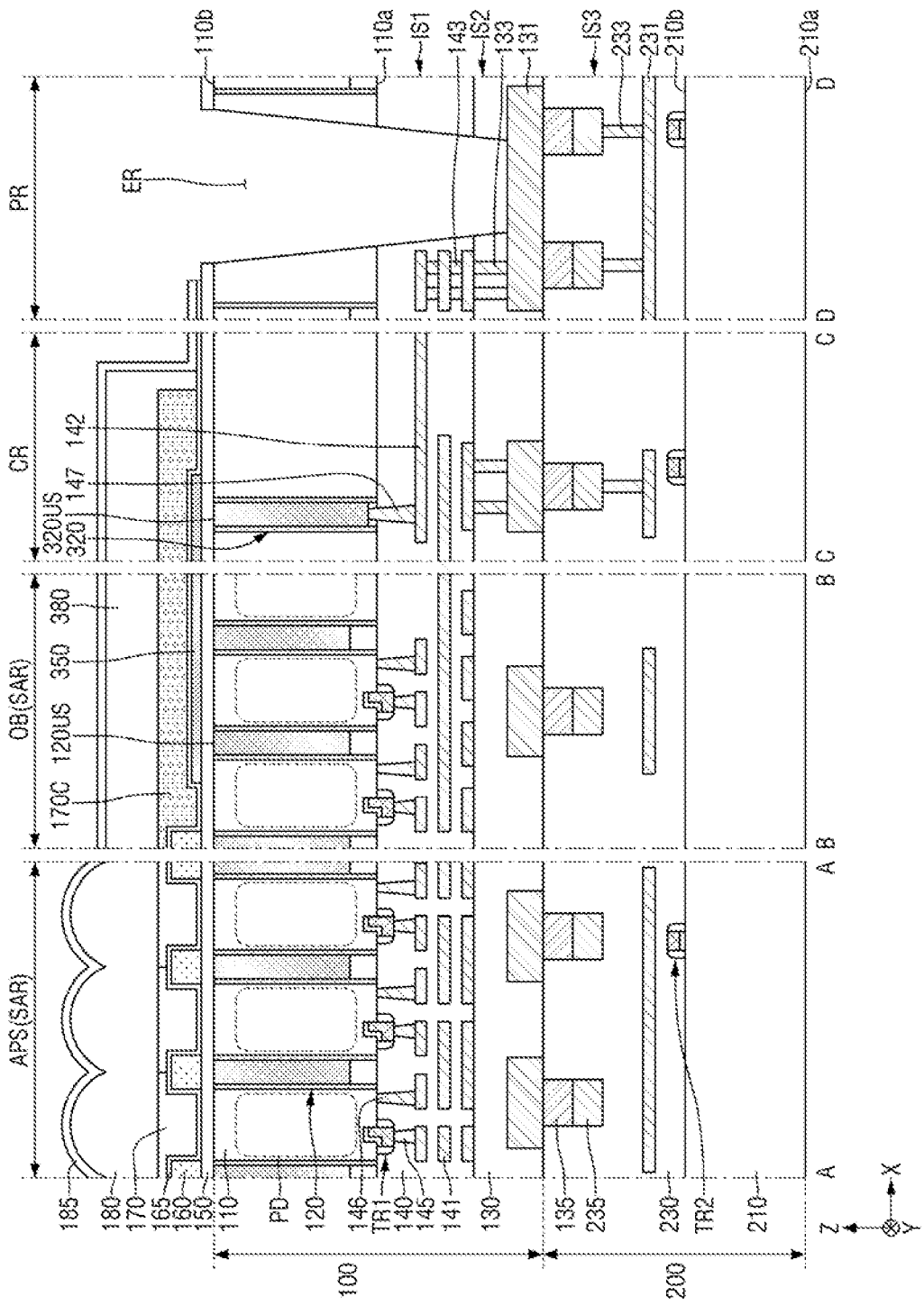
FIG. 9 is a cross-sectional view taken along A-A, B-B, C-C and D-D of FIG. 3 according to embodiments of the present inventive concept.

FIG. 9 is an exemplary diagram for explaining an image sensor according to some embodiments. For convenience of explanation, points different from those described using FIGS. 4 and 5 will be mainly described and a repeated description of similar or identical elements may be omitted for convenience of explanation.

Referring to FIG. 9, the first connection pattern 135 may be placed inside the third inter-wiring insulating film 230.

For example, the first connection pattern 135 may be disposed in the third structure IS3. The first connection pattern 135 may be disposed on the lower surface of the pad 131. For example, an upper surface of the first connection pattern 135 may directly contact a lower surface of the pad 131. In an embodiment, the lower surface of the pad 131 may be positioned on the same plane as the lower surface of the second inter-wiring insulating film 130 (e.g., in the third direction Z). The second connection pattern 235 may be disposed in the third inter-wiring insulating film 230. The second connection pattern 235 may be embedded in the third inter-wiring insulating film 230. For example, the second connection pattern 235 may not be exposed from the surface of the second inter-wiring insulating film 130. An upper surface of the second connection pattern 235 may not be exposed from the surface of the third inter-wiring insulating film 230.

In an embodiment, the first connection pattern 135 may be, for example, a solder bump. However, embodiments of the present inventive concept are not limited thereto. In an embodiment, the first connection pattern 135 may have various shapes such as a land, a ball, a pin, a pillar, etc.

In an embodiment, the first connection pattern 135 may include a substance of a solder material. For example, the first connection pattern 135 may include at least one compound selected from lead (Pb), tin (Sn), indium (In), bismuth (Bi), antimony (Sb), silver (Ag), and alloys thereof. However, embodiments of the present inventive concept are not limited thereto.

Figure 10:
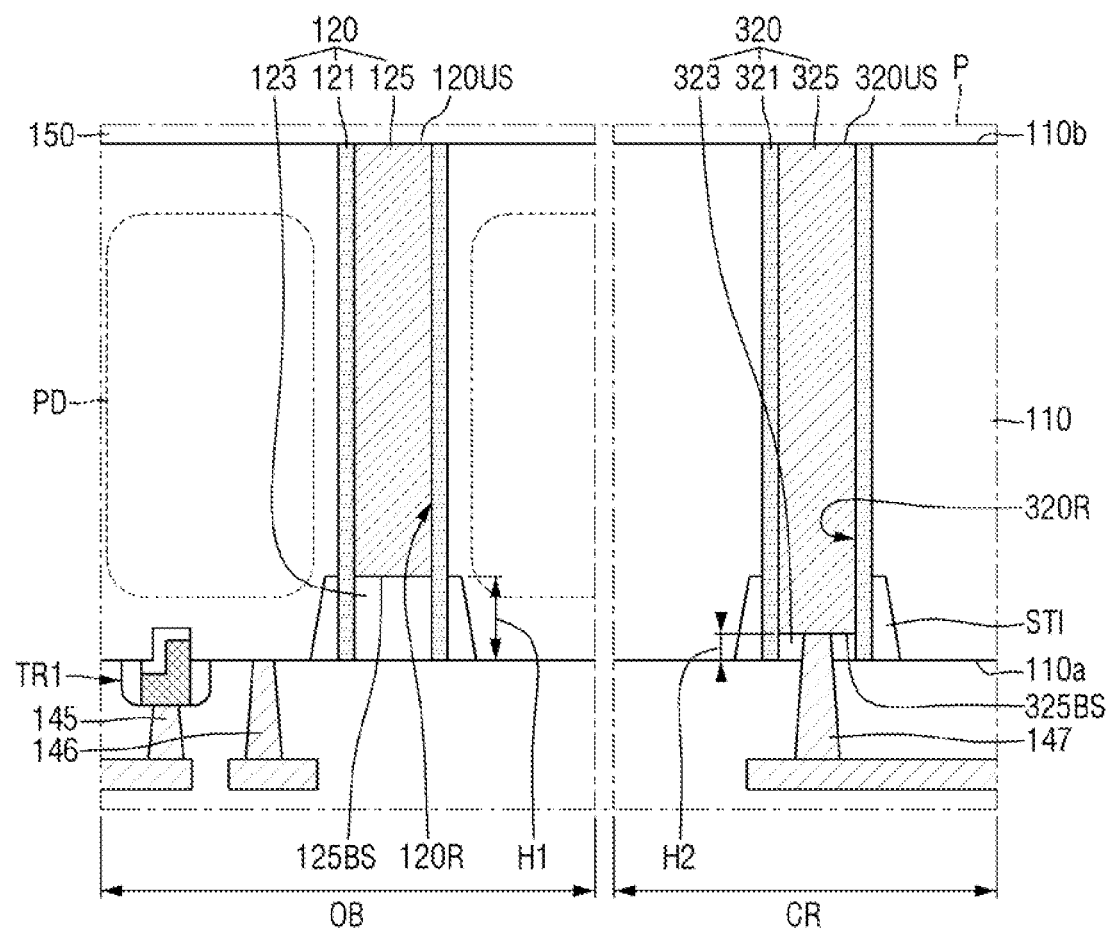
FIG. 10 is an enlarged view of a region P of FIG. 4 according to an embodiment of the present inventive concept.

FIG. 10 is an exemplary diagram for explaining an image sensor according to some embodiments. For convenience of explanation, points different from those described using FIGS. 4 and 5 will be mainly described and a repeated description of similar or identical elements may be omitted for convenience of explanation.

Referring to FIG. 10, the image sensor according to some embodiments may further include an element separation film ST1 embedded in the first substrate 110.

The element separation film ST1 may be disposed to penetrate the first surface 110a of the first substrate 110. In an embodiment, the element separation film ST1 may include, for example, at least one compound selected from a silicon oxide film, a silicon nitride film and a silicon oxynitride film. However, embodiments of the present inventive concept are not limited thereto.

The separation structure SST may be disposed to penetrate the element separation film ST1. For example, the pixel separation pattern 120 and the dummy pixel separation pattern 320 may be disposed to penetrate the element separation film ST1. Although the bottom surface 125BS of the pixel separation filling film 125 and the bottom surface 325BS of the dummy pixel separation filling film 325 are shown to be positioned on the same plane as the lower surface of the element separation film ST1 (e.g., in the third direction Z), this is merely for convenience of explanation, and embodiments of the present inventive concept are not limited thereto.

FIGS. 11A to 11D are enlarged views of a region R of FIG. 3. The dummy pixel separation pattern 320 and the third contact 147 will be described in more detail referring to FIGS. 11A to 11D. For convenience of explanation, points different from those described using FIGS. 1A to 10 will be mainly described and a repeated description of similar or identical elements may be omitted for convenience of explanation.

Referring to FIGS. 11A to 11D, the dummy pixel separation pattern 320 may be arranged in the form of a grid in a plane defined in the first and second directions X, Y.

The dummy pixel separation pattern 320 may separate each unit pixel PX in the plane defined in the first and second directions X, Y.

The dummy pixel separation pattern 320 may include a first line region L1 extending in the first direction X. The dummy pixel separation pattern 320 may include a second line region L2 extending in the second direction Y. The dummy pixel separation pattern 320 may include an intersection region IR in which the first line region L1 and the second line region L2 intersect.

Figure 11A:
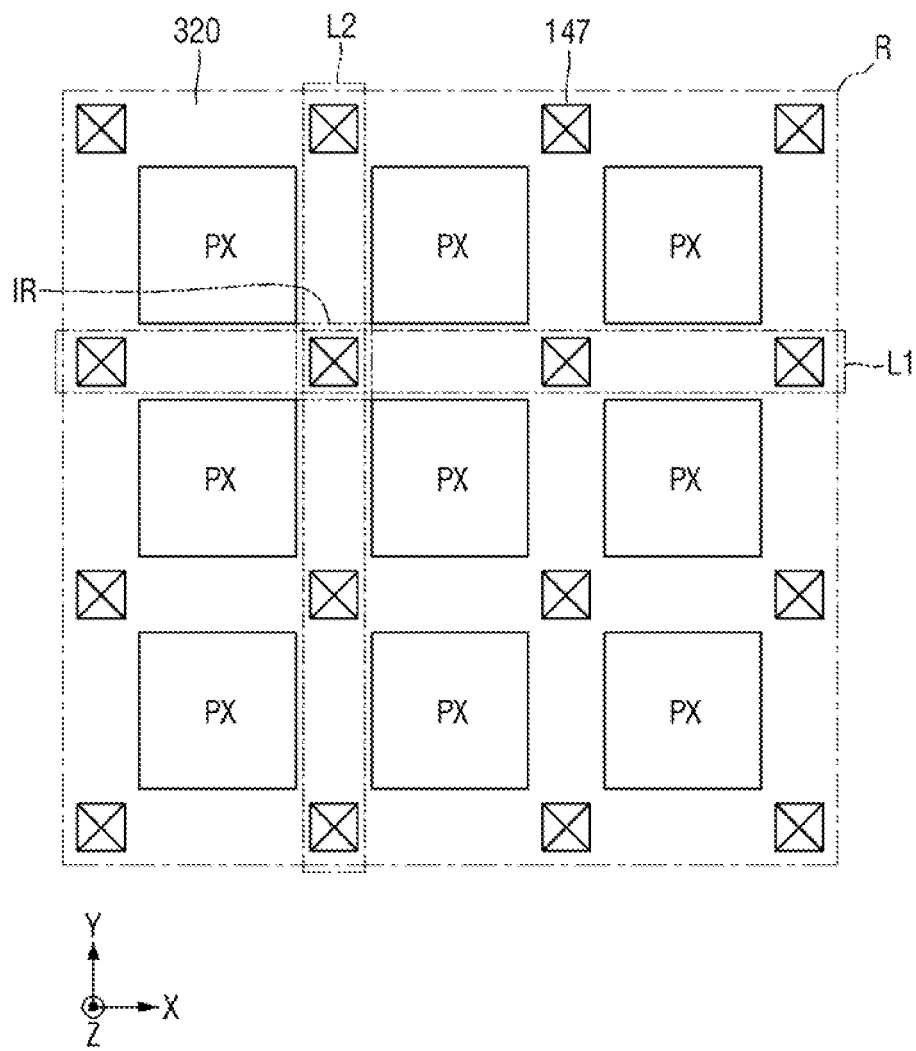
FIGS. 11A to 11D are enlarged views of a region R of FIG. 3 according to embodiments of the present inventive concept.

In FIG. 11A, the third contact 147 may be disposed in the intersection region IR in which the first line region L1 and the second line region L2 intersect. For example, the third contact 147 does not overlap the unit pixel PX in a plane defined in the first direction X and the second direction Y.

Figure 11B:
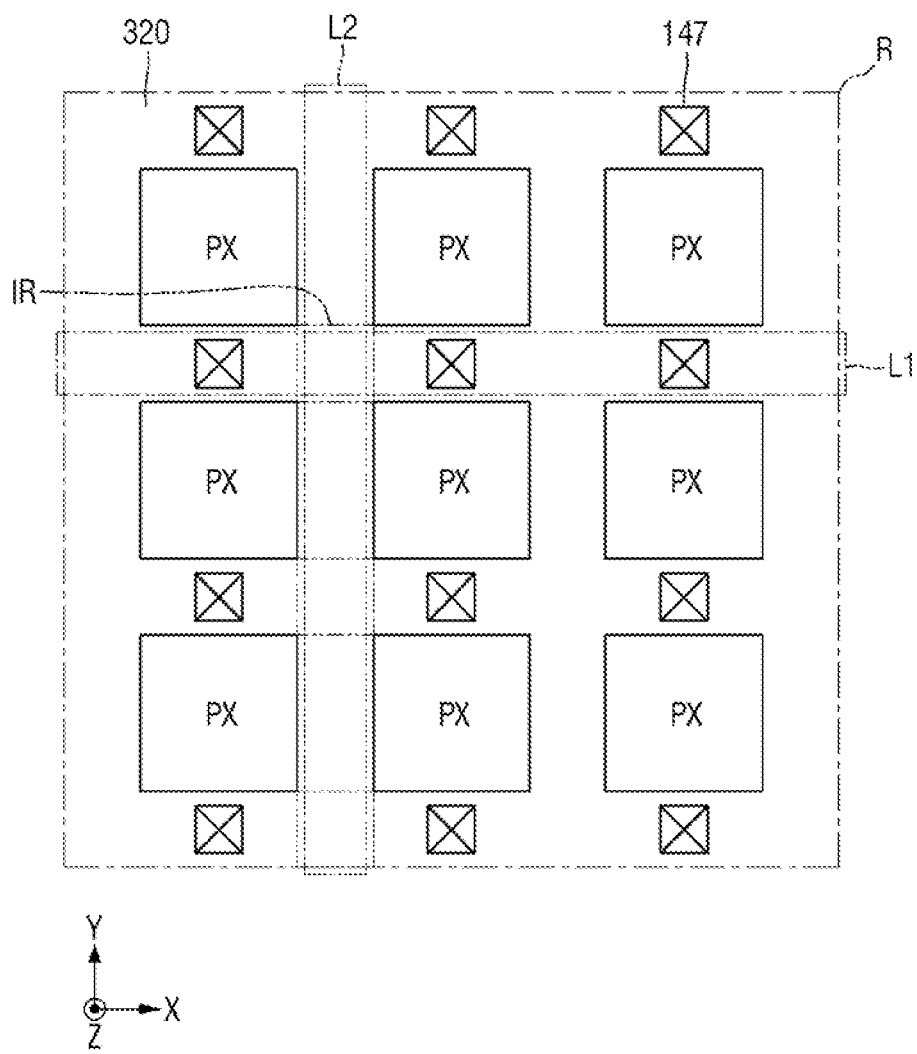

In FIG. 11B, the third contact 147 may be disposed on the first line region L1. The third contact 147 is not disposed on the second line region L2. The third contact 147 may have an island shape. For example, the third contact 147 overlaps the unit pixel PX in the second direction Y. The third contact 147 does not overlap the unit pixel PX in the first direction X. In an embodiment, a width of the third contact 147 in the first direction X is less than a width of the unit pixel PX in the first direction X.

Figure 11C:
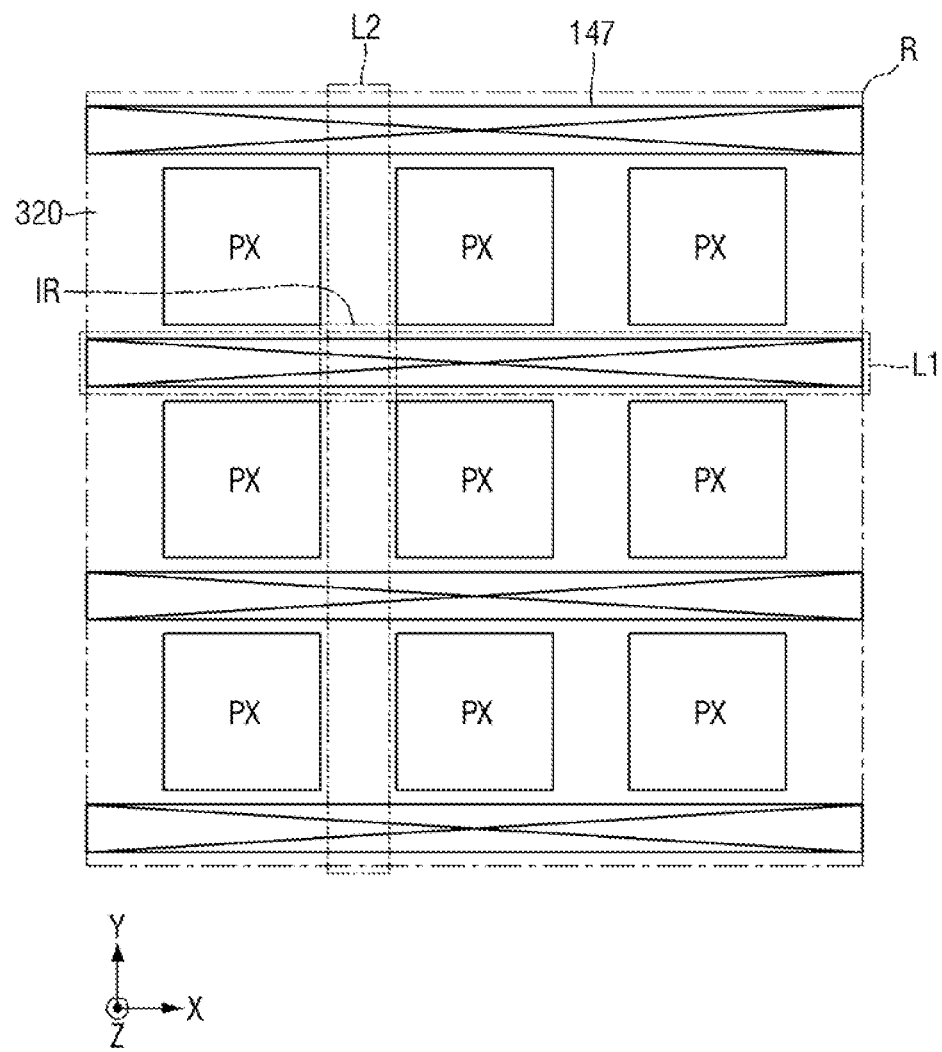

In FIG. 11C, the third contact 147 extends longitudinally along the first line region LI. For example, a portion of the third contact 147 is disposed on the second line region L2.

Figure 11D:
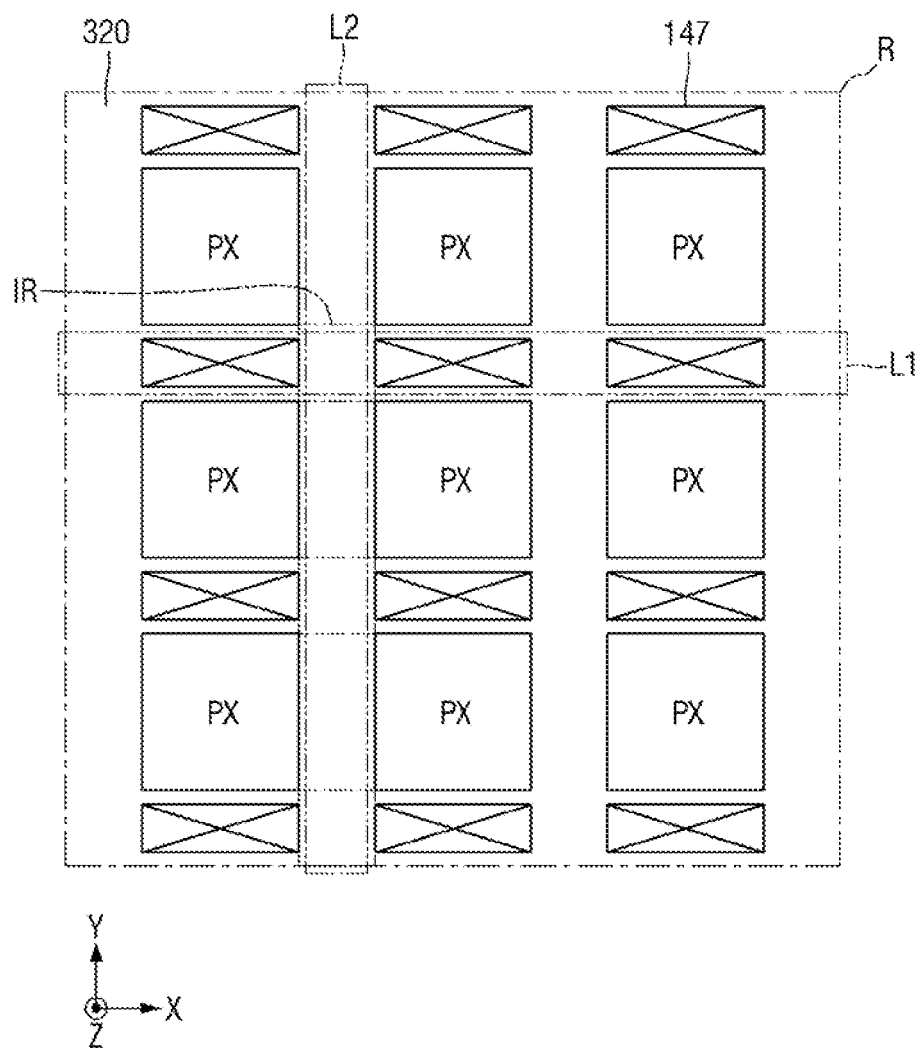

In FIG. 11D), the third contact 147 is disposed on the first line region L1. The third contact 147 is not disposed on the second line region L2. In an embodiment, the width of the third contact 147 in the first direction X is the same as the width of the unit pixel PX in the first direction X.

Figure 12:
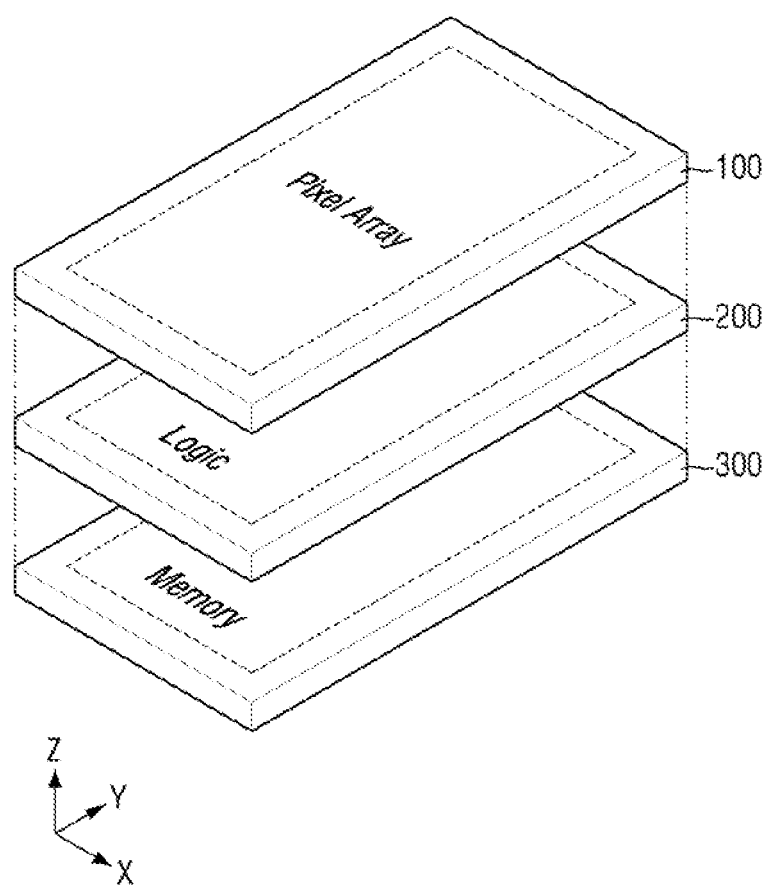
FIG. 12 is a perspective view of an image sensor according to an embodiment of the present inventive concept.

FIG. 12 is a diagram showing a conceptual layout of an image sensor according to some embodiments. For convenience of explanation, points different from those described using FIG. 2 will be mainly described and a repeated description of same or similar elements may be omitted for convenience of explanation.

Referring to FIG. 12, the image sensor according to some embodiments may further include a third substrate structure 300. The first substrate structure 100, the second substrate structure 200, and the third substrate structure 300 may be sequentially stacked along the third direction Z. The third substrate structure 300 may be disposed below the second substrate structure 200. For example, the second substrate structure 200 may be disposed between the first substrate structure 100 and the third substrate structure 300 (e.g., in the third direction Z).

The third substrate structure 300 may include a memory device. The third substrate structure 300 may include, for example, a volatile memory device such as a DRAM or a SRAM. The third substrate structure 300 may receive signals from the first substrate structure 100 and the second substrate structure 200 to process the signals through the memory device. For example, the image sensor including the third substrate structure 300 may correspond to a 3-stack image sensor.

FIGS. 13 to 22 are intermediate diagrams for explaining a method of manufacturing the image sensor according to some embodiments.

The method of manufacturing the image sensor according to some embodiments will be described using FIGS. 13 to 22.

Figure 13:
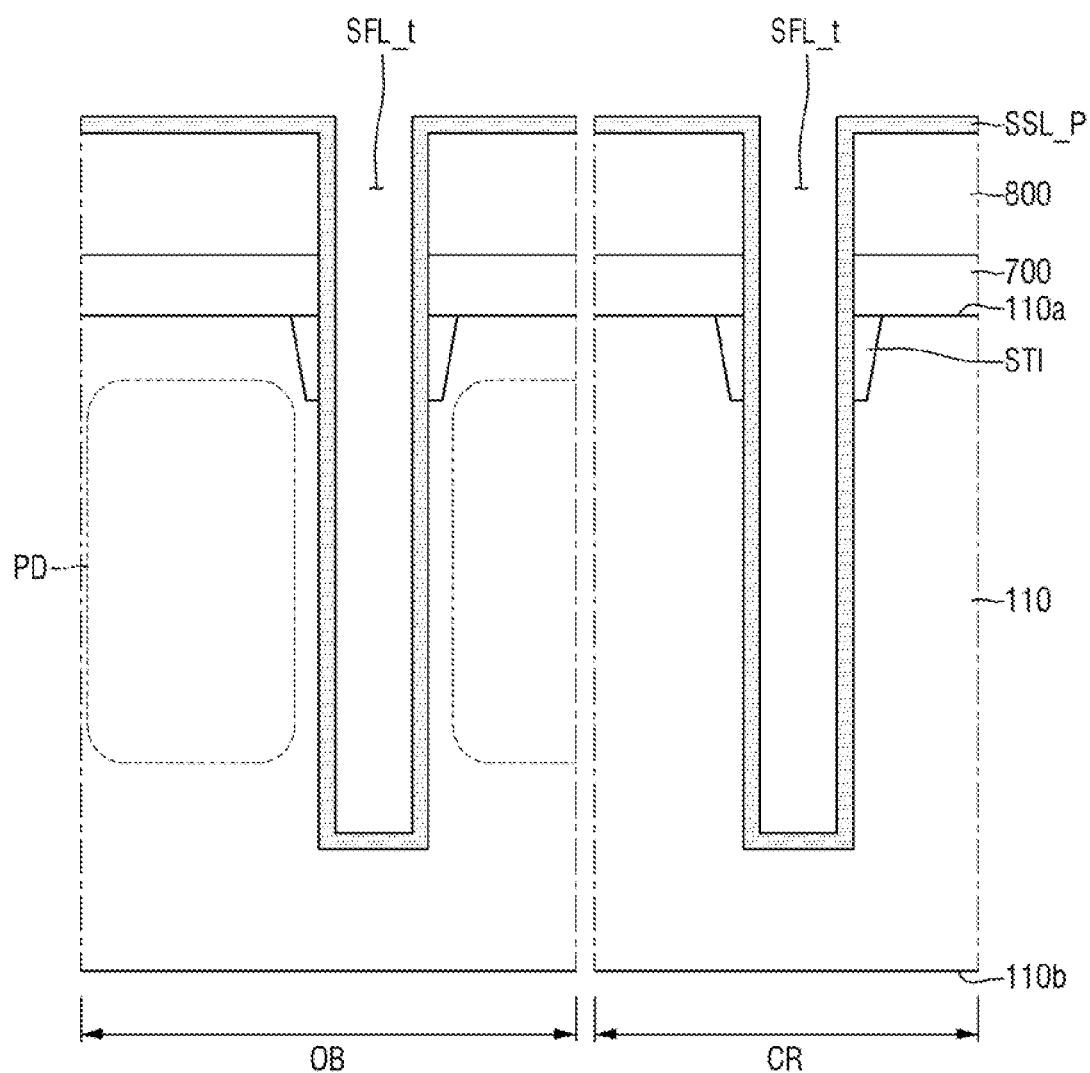
FIGS. 13 to 22 are cross-sectional views for explaining a method of manufacturing the image sensor according to embodiments of the present inventive concept.

Referring to FIG. 13, an element separation film ST1 may be formed in the first substrate 110. The first substrate 110 may include a first surface 110a, and a second surface 110b opposite to the first surface 110a (e.g., in the third direction Z).

A photoelectric conversion layer PD may be formed in the first substrate 110 of the light-shielding region OB. The photoelectric conversion layer PD may not be formed in the first substrate 110 of the connecting region CR. However, embodiments of the present inventive concept are not limited thereto. Although the light-shielding region OB and the connecting region CR are shown as being spaced apart from each other, this is merely for convenience of explanation, and the disclosure is not limited thereto.

A mask film 700 and a sacrificial film 800 may be formed on the first surface 110a of the first substrate 110. In an embodiment, the mask film 700 may include, for example, silicon nitride. The sacrificial film 800 may include, for example, silicon oxide. However, embodiments of the present inventive concept are not limited thereto.

A separation filling trench SFL_t that penetrates the sacrificial film 800, the mask film 700 and the element separation film ST1 may be formed. The separation filling trench SFL_t may be formed inside the first substrate 110. For example, a bottom surface of the separation filling trench SFL_t may be positioned higher than the second surface 110b of the first substrate 110 (e.g., in the third direction Z).

A pre-separation spacer film SSL_P may be formed along the side wall of the separation filling trench SFL_t, the bottom surface of the separation filling trench SFL_t and the upper surface of the sacrificial film 800. In an embodiment, the pre-separation spacer film SSL_P may include, for example, at least one compound selected from silicon oxides, aluminum oxides, tantalum oxides, and combinations thereof. However, embodiments of the present inventive concept are not limited thereto.

Figure 14:
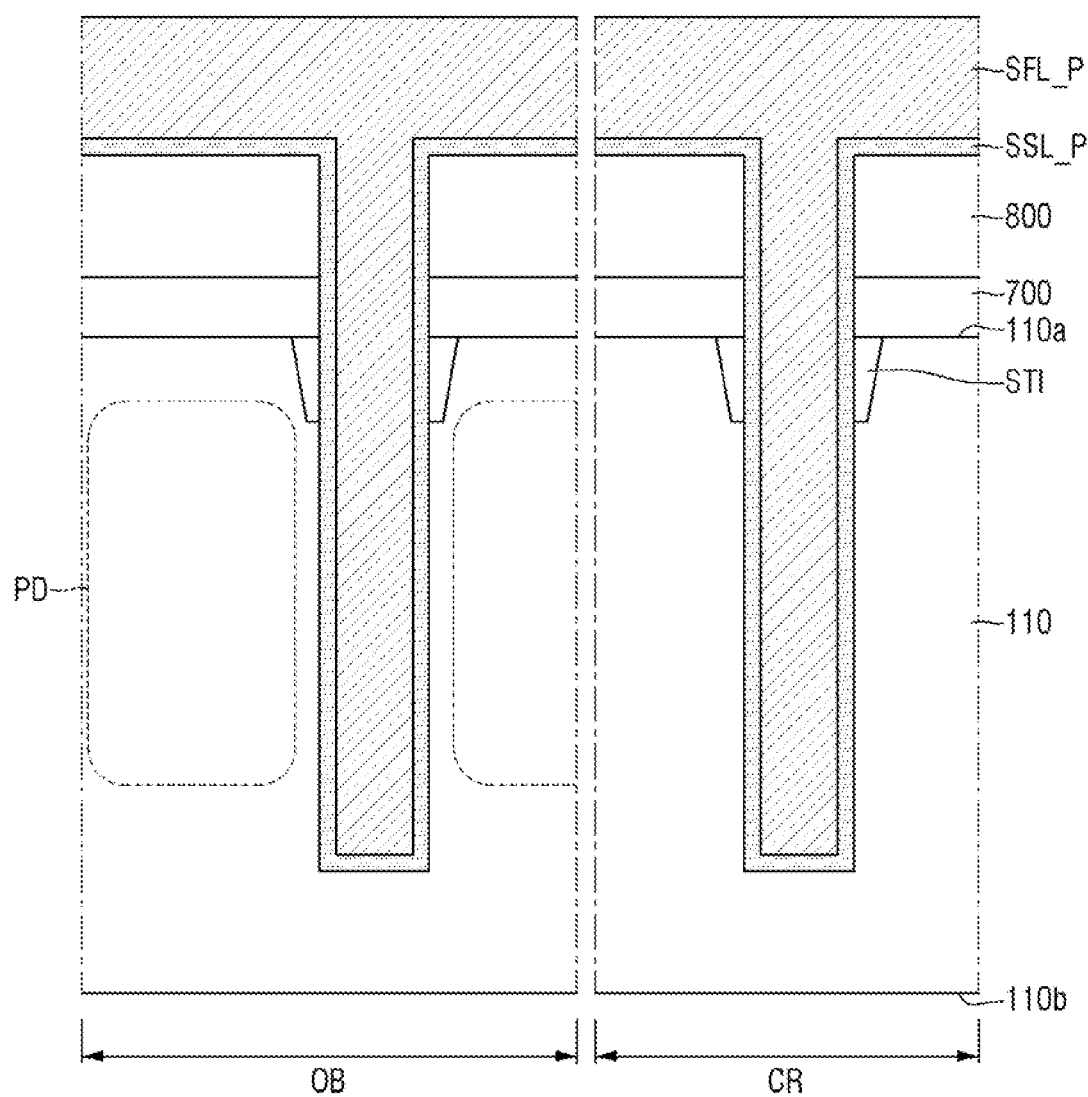

Referring to FIG. 14, a pre-separation filling film SFL_P that fills the separation filling trench SFL_t may be formed.

The pre-separation filling film SFL_P may cover the pre-separation spacer film SSL_P. The pre-separation filling film SFL_P may include a conductive substance. For example, in an embodiment, the pre-separation filling film SFL_P may include polysilicon (poly Si). However, embodiments of the present inventive concept are not limited thereto.

Figure 15:
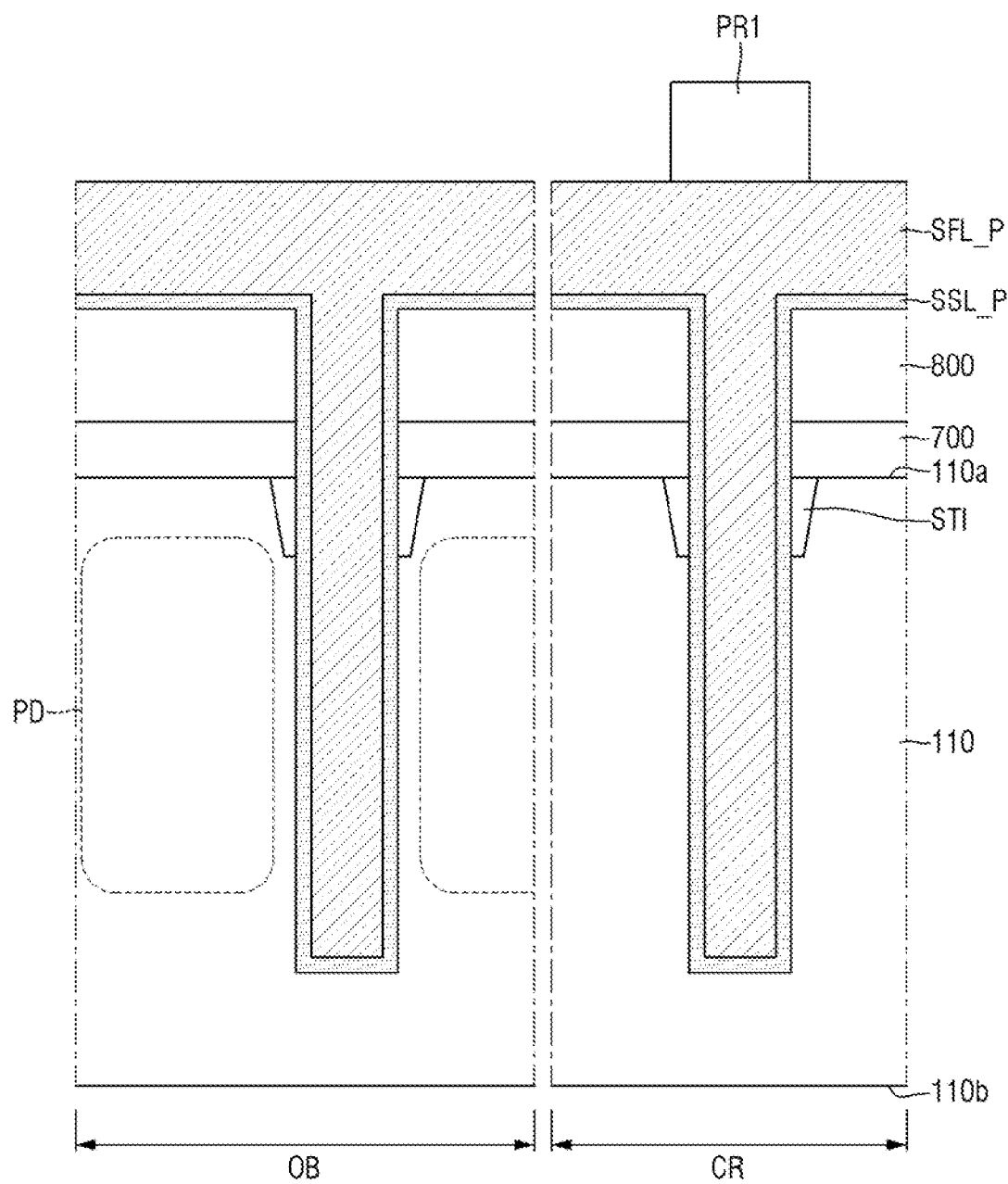

Referring to FIG. 15, a first photosensitive film PR1 may be formed on the pre-separation filling film SFL_P.

The first photosensitive film PR1 may be formed on the pre-separation filling film SFL_P of the connecting region CR (e.g., formed directly thereon in the third direction Z). The first photosensitive film PR1 may be formed at a position where it overlaps the separation filling trench SFL_t of the connecting region CR in the vertical direction (e.g., the third direction Z).

Figure 16:
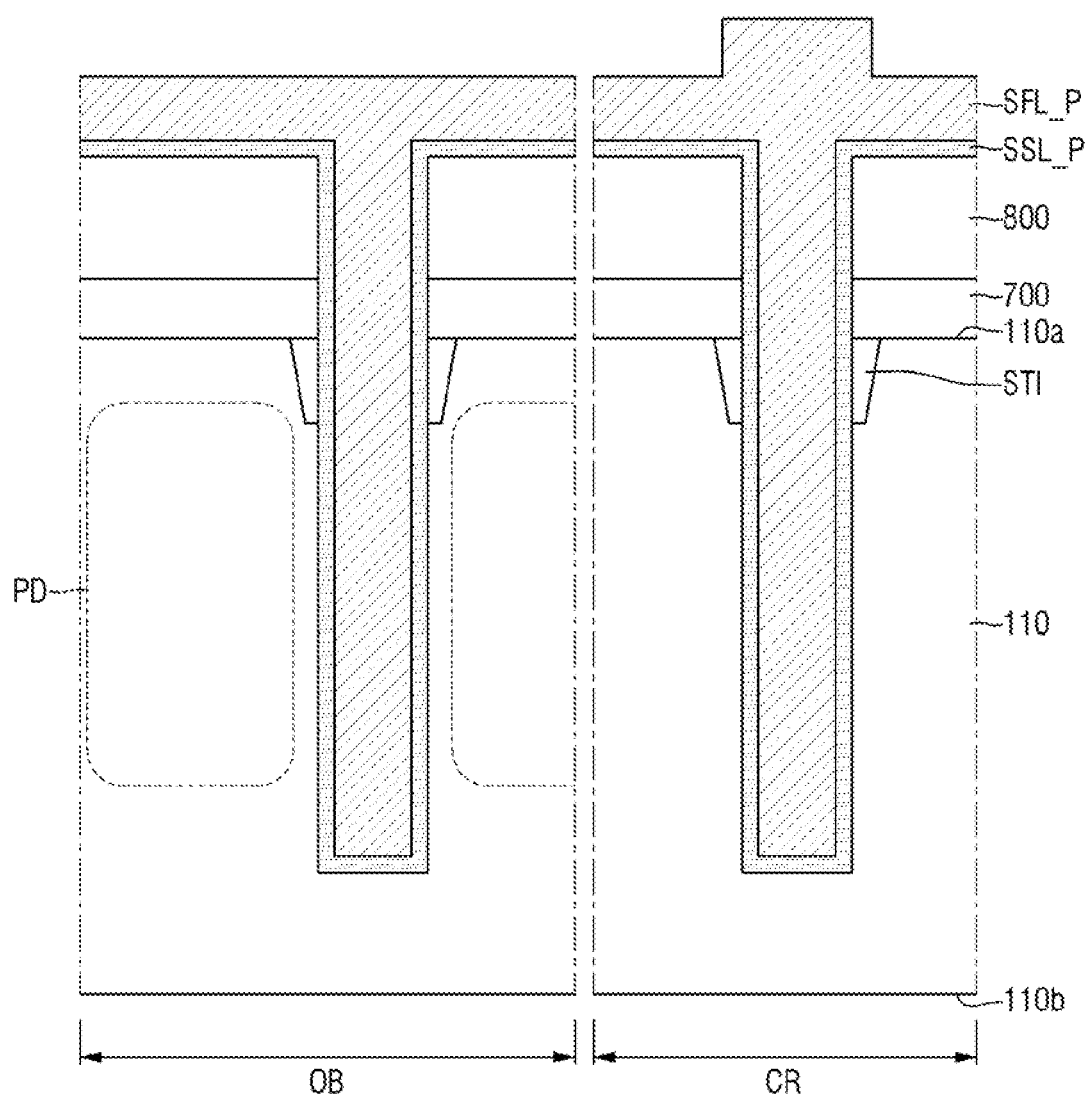

Referring to FIG. 16, a portion of the pre-separation filling film SFL_P may be removed. For example, a portion of the upper surface of the pre-separation filling film SFL_P may be removed. Subsequently, the first photosensitive film PR1 may be removed.

The pre-separation filling film SFL_P may be stepped by the first photosensitive film PR1. For example, the pre-separation/filling film SFL_P of the portion in which the first photosensitive film PR1 is formed may protrude (e.g., in the third direction Z) from the pre-separation filling film SFL_P of the portion in which the first photosensitive film PR1 is not formed.

Figure 17:
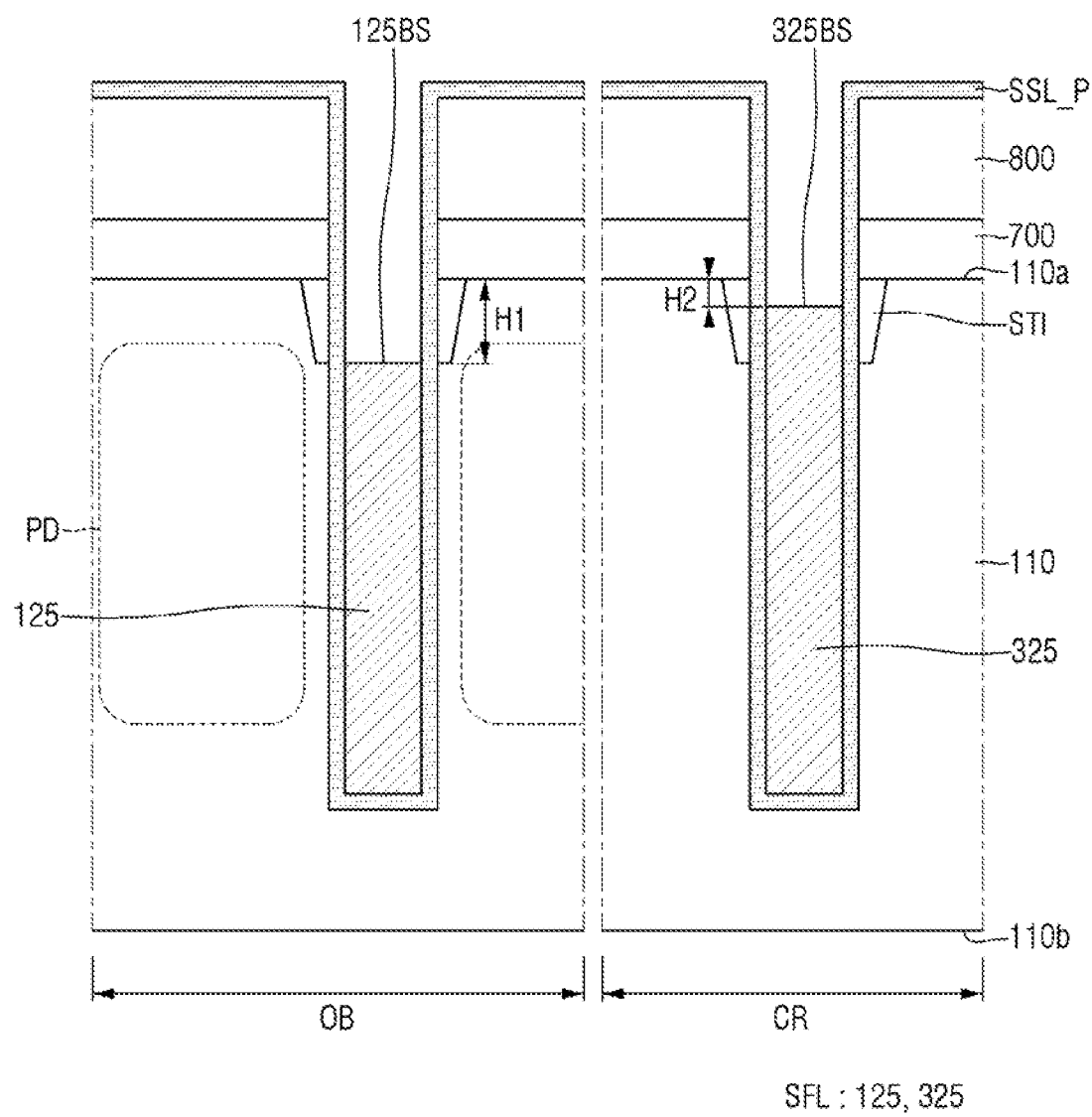

Referring to FIG. 17, the pre-separation filling film SFL_P may be removed to form a separation filling film SFL.

In an embodiment, the separation filling film SFL may include a pixel separation filling film 125 formed in the light-shielding region OB, and a dummy pixel separation filling film 325 formed in the connecting region CR. A depth of the pixel separation filling film 125 may be less than a depth of the dummy pixel separation filling film 325. A height H1 from the first surface 110a of the first substrate 110 to the bottom surface 125BS of the pixel separation filling film 125 may be greater than a height H2 from the first surface 110a of the first substrate 110 to the bottom surface 325BS of the dummy pixel separation filling film 325.

Figure 18:
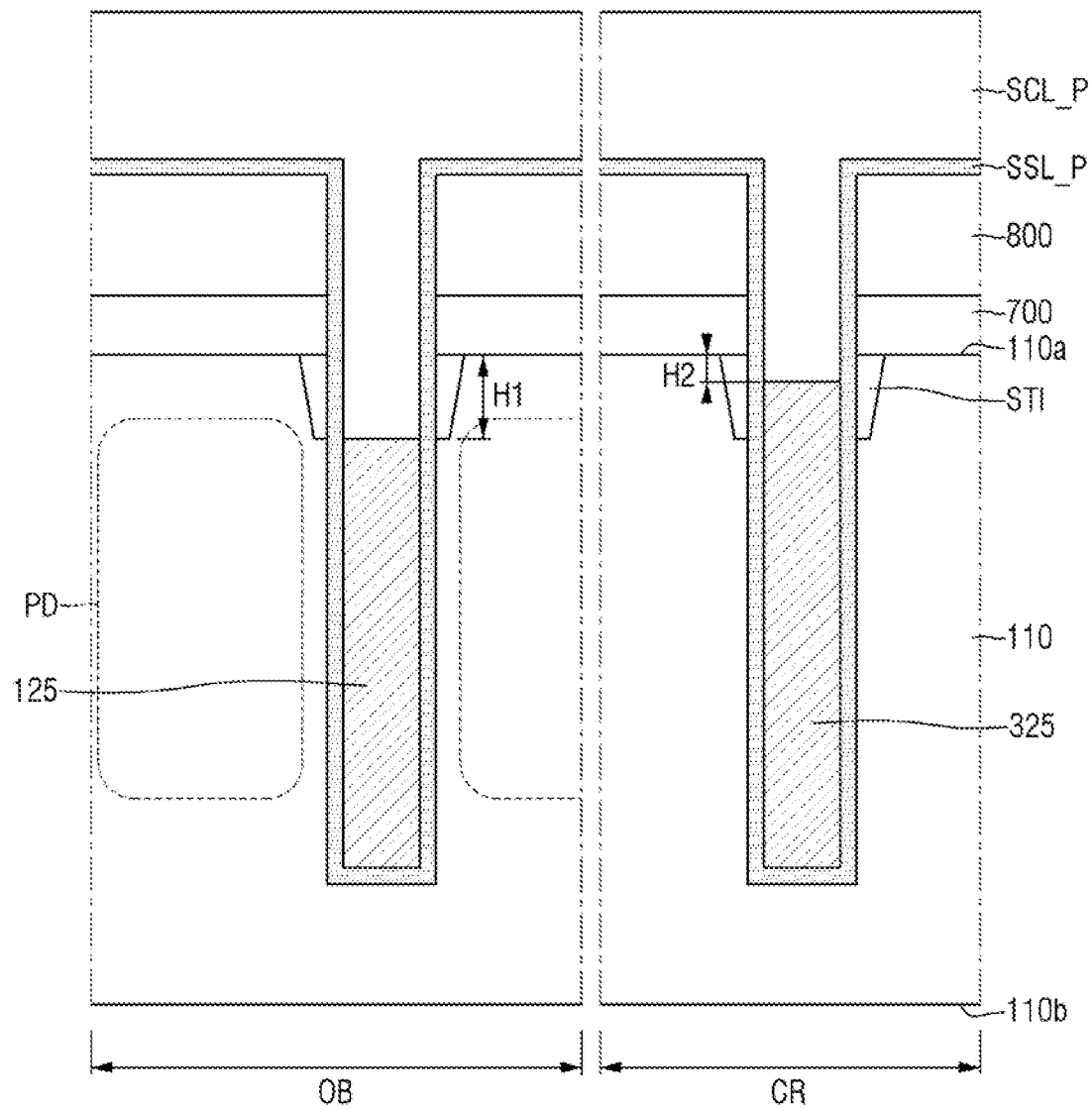

Referring to FIG. 18, a pre-separation capping film SCL_P may be formed on the separation filling film SFL.

The pre-separation capping film SCL_P may cover the upper surface of the pre-separation spacer film SSL_P. In an embodiment, the pre-separation capping film SCL_P may include, for example, silicon oxide. However, embodiments of the present inventive concept are not limited thereto.

Figure 19:
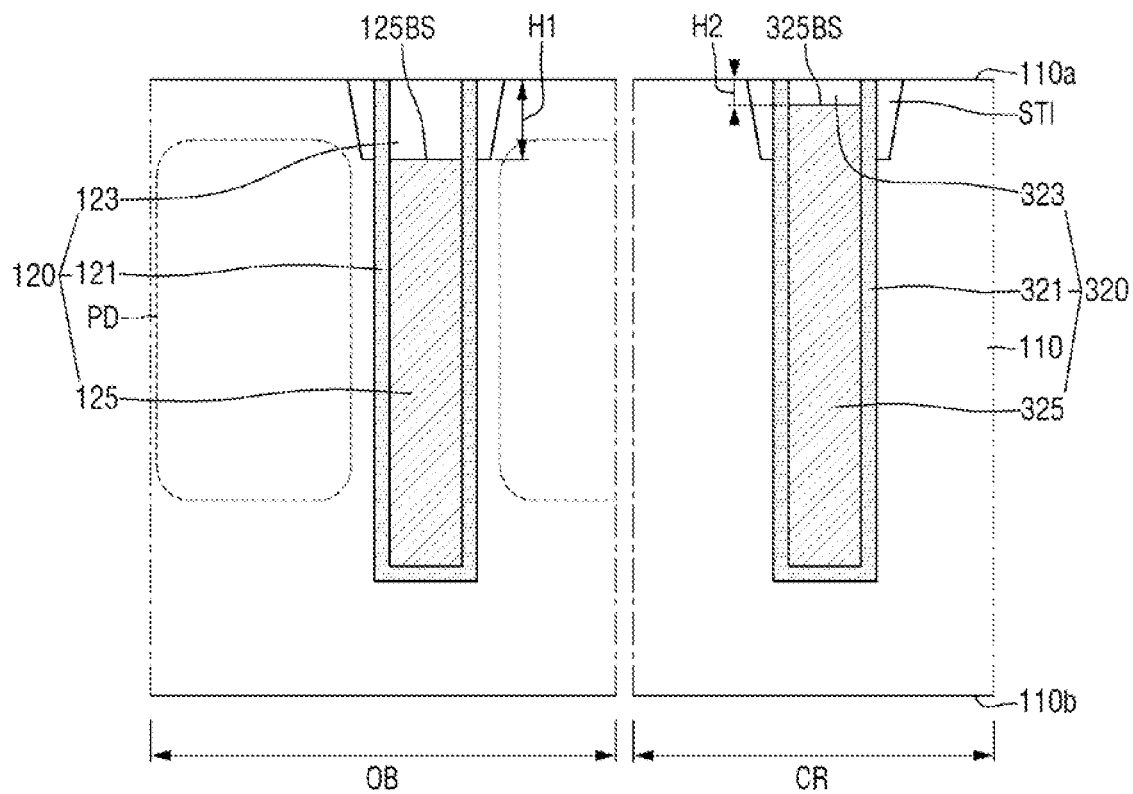

Referring to FIG. 19, the pre-separation spacer film SSL_P and the pre-separation capping film SCL_P may be removed to form the separation spacer film SSL and the separation capping film SCL.

For example, a separation structure SST may be formed. The separation structure SST may include a separation spacer film SSL, a separation filling film SFL, and a separation capping film SCL.

The separation structure SST includes a pixel separation pattern 120 formed in the light-shielding region OB, and a dummy pixel separation pattern 320 formed in the connecting region CR.

The separation spacer film SSL includes a pixel separation spacer film 121 formed in the light-shielding region OB, and a dummy pixel separation spacer film 321 formed in the connecting region CR.

The separation capping film SCL includes a pixel separation capping film 123 formed in the light-shielding region OB, and a dummy pixel separation capping film 323 formed in the connecting region CR.

The pre-separation spacer film SSL_P and the pre-separation capping film SCL_P may be removed to expose the first surface 110a of the first substrate 110.

Figure 20:
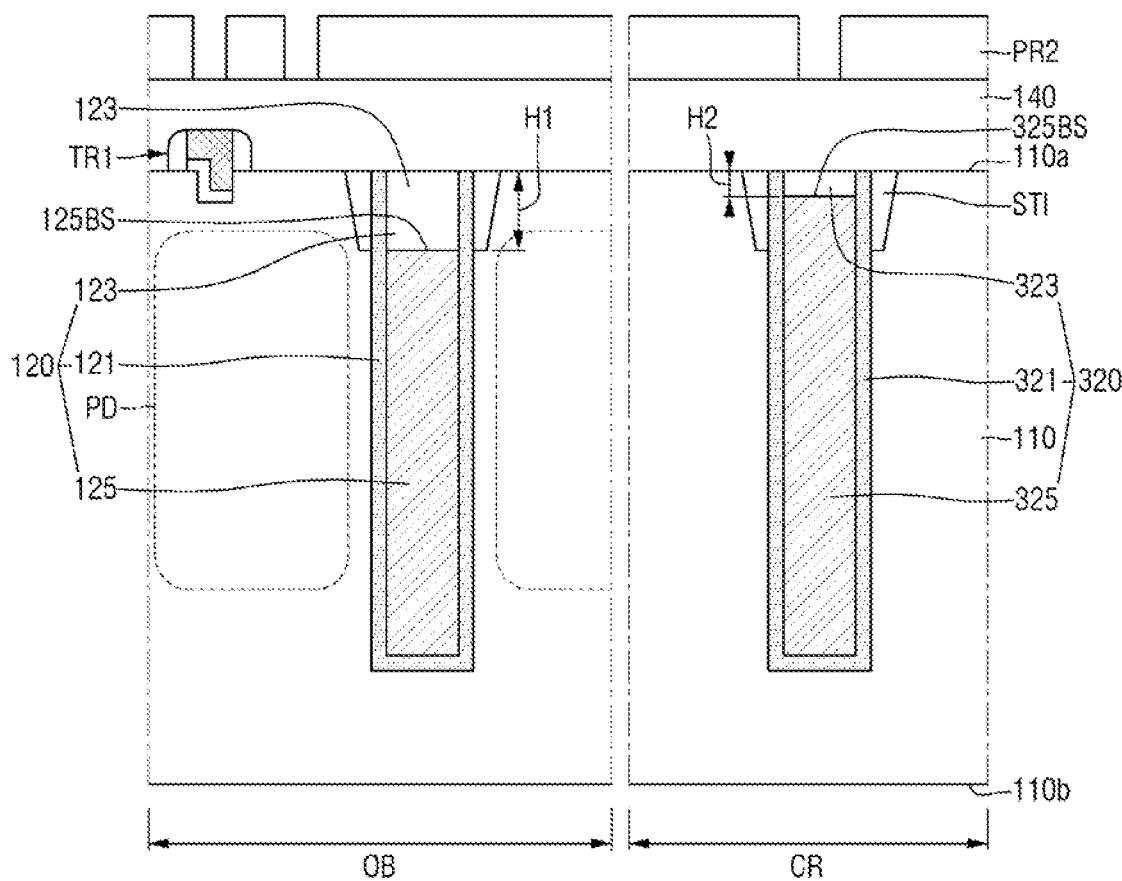

Referring to FIG. 20, the first inter-wiring insulating film 140 may be formed on the first surface 110a of the first substrate 110. For example, the first inter-wiring insulating film 140 may be formed directly on the first surface 110a of the first substrate 110.

The first electronic element TR1 may be formed in the first inter-wiring insulating film. A second photosensitive film PR2 may be formed on the first inter-wiring insulating film 140 (e.g., formed directly thereon).

In an embodiment, the second photosensitive film PR2 may be used as a mask for forming first to third contacts to be described later.

Figure 21:
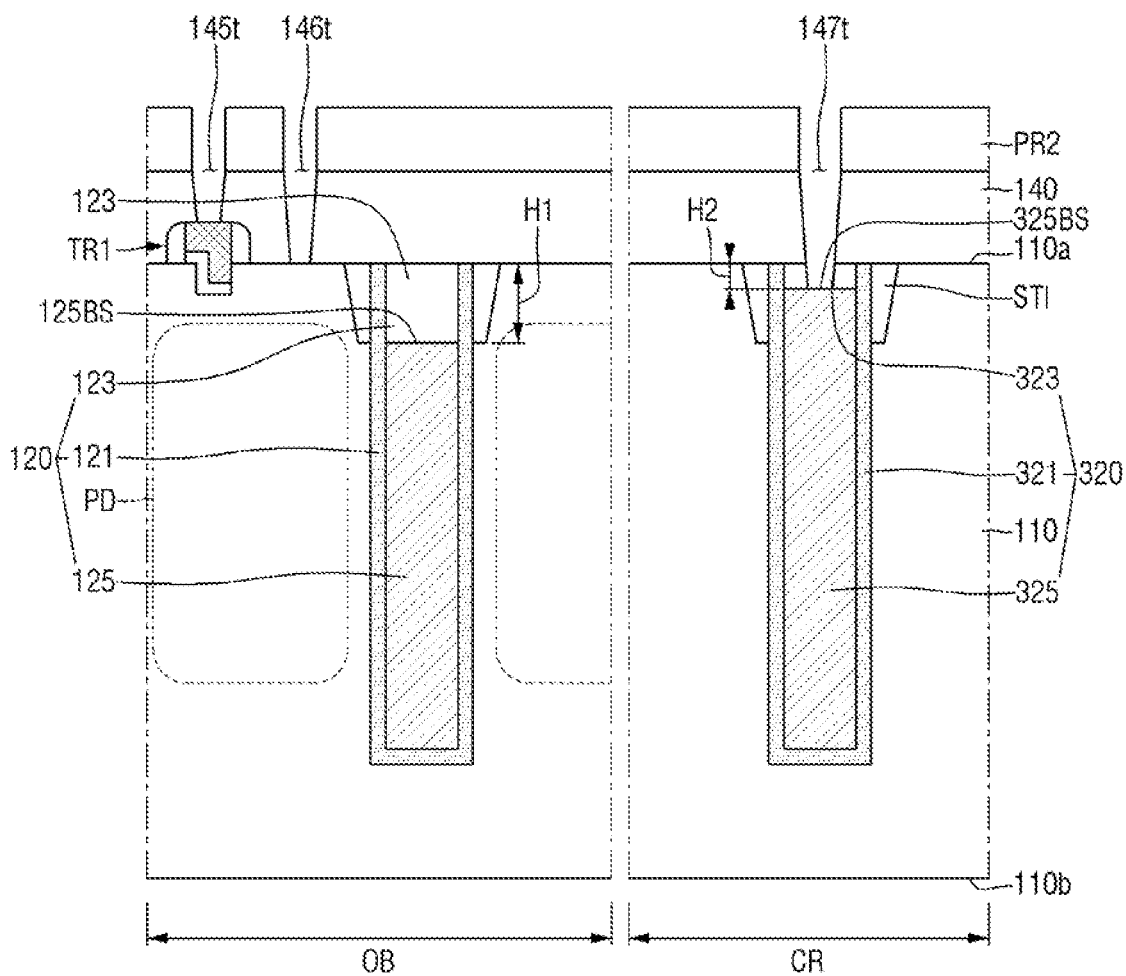

Referring to FIG. 21, a first contact trench 145t, a second contact trench 146t and a third contact trench 147t may be formed, using the second photosensitive film PR2 as a mask.

The first contact trench 145t may penetrate the first inter-wiring insulating film 140 to expose the first electronic element TR1. The second contact trench 146t may penetrate the first inter-wiring insulating film 140 to expose the first surface 110a of the first substrate 110. The third contact trench 147t may penetrate the first inter-wiring insulating film 140 and the dummy pixel separation capping film 323 to expose the dummy pixel separation filling film 325.

In an embodiment, the first contact trench 145t, the second contact trench 146t, and the third contact trench 147t may be formed at the same level. The upper surfaces of the first contact trench 145t, the second contact trench 146t, and the third contact trench 147t may be co-planar (e.g., in the third direction Z).

Figure 22:
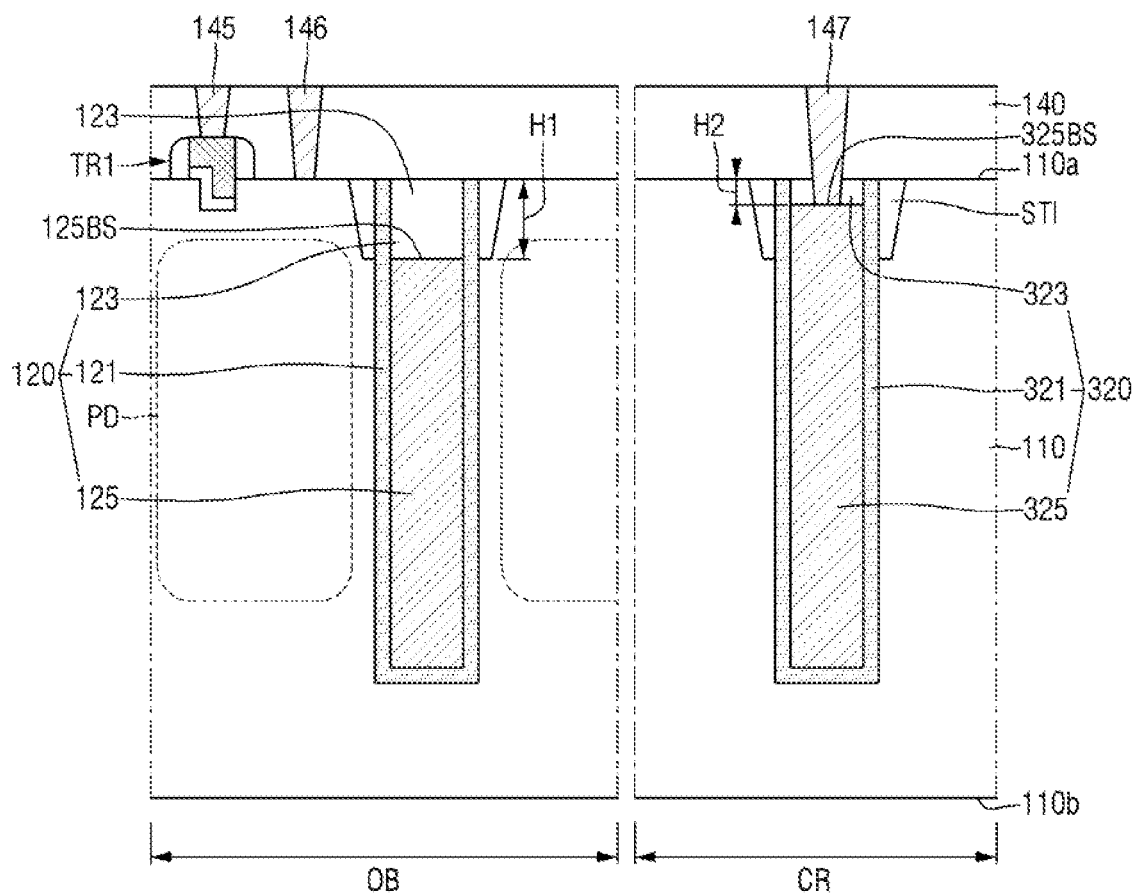

Referring to FIG. 22, a first contact 145, a second contact 146, and a third contact 147 may be formed.

The first contact 145 may fill the first contact trench 145t. The second contact 146 may fill the second contact trench 146t. The third contact 147 may fill the third contact trench 147t.

The first contact 145 may be connected to the first electronic element TR1. The second contact 146 may be connected to the first substrate 110. The third contact 147 may be connected to the dummy pixel separation filling film 325.

The first contact 145, the second contact 146, and the third contact 147 may be formed at the same level. The upper surfaces of the first contact 145, the second contact 146, and the third contact 147 may be co-planar (e.g., in the third direction Z).

Referring to FIG. 4 again, after forming the first contact 145, the second contact 146 and the third contact 147, the second inter-wiring insulating film 130 may be formed on the first inter-wiring insulating film 140. The pad 131, the plurality of wirings and the plurality of contacts may be formed inside the second wiring insulating film.

Subsequently, the second surface 110b of the first substrate 110 may be removed, using a flattening process. The first substrate 110 may be removed until the separation filling film SFL is exposed. For example, the first substrate 110 may be removed until the bottom surface of the separation spacer film SSL is removed. Therefore, the second surface 110b of the first substrate 110 may expose the separation filling film SFL.

In concluding the detailed description, those skilled in the art will appreciate that many variations and modifications may be made to the described embodiments without substantially departing from the principles of the present inventive concept. Therefore, the described embodiments of the present inventive concept are used in a generic and descriptive sense only and not for purposes of limitation.

What is claimed is:

1. An image sensor comprising:
   a substrate that includes a first surface and a second surface opposite to each other, and includes a first region and a second region disposed around the first region;
   a plurality of unit pixels arranged inside the first region of the substrate, each of the plurality of unit pixels including a photoelectric conversion layer;
   a pixel separation pattern that extends from the first surface of the substrate to the second surface of the substrate in the first region of the substrate, separates each of the plurality of unit pixels, and includes a pixel separation spacer film and a pixel separation filling film, the pixel separation spacer film defining a pixel separation recess, the pixel separation pattern filling a portion of the pixel separation recess;
   a dummy pixel separation pattern that extends from the first surface of the substrate to the second surface of the substrate in the second region of the substrate, and includes a dummy pixel separation spacer film that defines a dummy pixel separation recess, a dummy pixel separation filling film that fills a first portion of the dummy pixel separation recess and a dummy pixel separation capping film that fills a second portion of the dummy pixel separation recess wherein a bottom surface of the dummy pixel separation filling film is spaced apart from the first surface of the substrate in a direction towards the second surface of the substrate and the dummy pixel separation capping film extends between the bottom surface of the dummy pixel separation filling film and the first surface of the substrate;
   a wiring structure disposed on the first surface of the substrate and including an inter-wiring insulating film and a first wiring in the inter-wiring insulating film;
   a color filter disposed on the second surface of the substrate; and
   a first contact that is directly connected to the dummy pixel separation filling film and connects the dummy pixel separation filling film to the first wiring,
   wherein a height from the first surface of the substrate to the bottom surface of the pixel separation filling film is greater than a height from the first surface of the substrate to a bottom surface of the dummy pixel separation filling film.

2. The image sensor of claim 1, wherein an upper surface of the pixel separation pattern is positioned on a same plane as an upper surface of the dummy pixel separation pattern.

3. The image sensor of claim 1, wherein:
   the pixel separation pattern includes a pixel separation capping film on the pixel separation filling film; and
   a depth of the dummy pixel separation capping film in a vertical direction is less than a depth of the pixel separation capping film in the vertical direction.

4. The image sensor of claim 1, further comprising:
   a microlens disposed on the second surface of the substrate,
   wherein the microlens is not disposed on the color filter in the second region of the substrate.

5. The image sensor of claim 1, further comprising:
   a pad disposed on the wiring structure and connected to the first wiring,
   wherein the first contact is connected to the pad.

6. The image sensor of claim 5, further comprising:
   a first connection pattern connected to a lower surface of the pad; and
   a second connection pattern on a lower surface of the first connection pattern, the second connection pattern is connected to the first connection pattern.

7. The image sensor of claim 5, wherein the dummy pixel separation filling film is electrically connected to the pad through the first contact.

8. The image sensor of claim 5, further comprising:
   a connecting structure that penetrates the substrate and is connected to the pad.

9. The image sensor of claim 1, wherein each of the unit pixels includes an electronic element that is connected to the photoelectric conversion layer.

10. The image sensor of claim 9, wherein:
    the wiring structure includes a second wiring; and
    the wiring structure further includes a second contact that connects the electronic element and the second wiring.

11. The image sensor of claim 1, wherein the dummy pixel separation filling film is configured to receive a ground voltage or a negative voltage.

12. An image sensor comprising:
    a substrate that includes a first surface and a second surface opposite to each other, and includes a first region and a second region disposed around the first region;
    a separation structure that extends from the first surface of the substrate to the second surface of the substrate and has a grid shape, the separation structure includes a separation spacer film, a separation filling film and a separation capping film, the separation spacer film defines a separation recess, the separation filling film filling a portion of the separation recess, wherein a bottom surface of the separation filling film in the second region of the substrate is spaced apart from the first surface of the substrate in a direction towards the second surface of the substrate, wherein the separation capping film extends between the bottom surface of the separation filling film in the second region of the substrate and the first surface of the substrate;
    a plurality of unit pixels arranged inside the first region of the substrate, each of the plurality of unit pixels including a photoelectric conversion layer that is disposed in the substrate;
    a wiring structure disposed on the first surface of the substrate and including an inter-wiring insulating film and a wiring in the inter-wiring insulating film;
    a microlens disposed on the second surface of the substrate in the first region of the substrate;
    a pad disposed on the wiring structure and connected to the wiring;

a contact disposed in the second region of the substrate, the contact is directly connected to the separation filling film and connects the separation filling film and the wiring,
wherein a height from the first surface of the substrate to a bottom surface of the separation filling film in the first region of the substrate is greater than a height from the first surface of the substrate to the bottom surface of the separation filling film in the second region of the substrate.

13. The image sensor of claim 12, wherein:
in the second region of the substrate, the separation structure includes a first line region extending in a first direction, and a second line region extending in a second direction perpendicular to the first direction; and
the contact is disposed at an intersection point where the first line region and the second line region intersect each other.

14. The image sensor of claim 12, wherein:
in the second region of the substrate, the separation structure includes a first line region extending in a first direction, and a second line region extending in a second direction perpendicular to the first direction; and
the contact extends along the first line region.

15. The image sensor of claim 12, wherein:
in the second region of the substrate, the separation structure includes a first line region extending in a first direction, and a second line region extending in a second direction perpendicular to the first direction; and
the contact is not disposed at any intersection point where the first line region and the second line region intersect each other.

16. The image sensor of claim 12, wherein an upper surface of the separation filling film in the first region of the substrate is positioned on a same plane as the upper surface of the separation filling film in the second region of the substrate.

17. The image sensor of claim 12, further comprising:
an element separation film disposed in the substrate,
wherein the separation structure is formed to penetrate the element separation film.

18. An image sensor comprising:
a substrate that includes a first surface and a second surface opposite to each other, and includes a first region and a second region disposed around the first region;
a plurality of unit pixels arranged inside the first region of the substrate, each of the plurality of unit pixels including a photoelectric conversion layer;
a pixel separation pattern that extends from the first surface of the substrate to the second surface of the substrate in the first region of the substrate, the pixel separation pattern separates each of the unit pixels, and includes a pixel separation spacer film that defines a pixel separation recess and a pixel separation filling film that fills a portion of the pixel separation recess;
a dummy pixel separation pattern that extends from the first surface of the substrate to the second surface of the substrate in the second region of the substrate, the dummy pixel separation pattern includes a dummy pixel separation spacer film that defines a dummy pixel separation recess, a dummy pixel separation filling film that fills a first portion of the dummy pixel separation recess and a dummy pixel separation capping film that fills a second portion of the dummy pixel separation recess, wherein a bottom surface of the dummy pixel separation filling film is spaced apart from the first surface of the substrate in a direction towards the second surface of the substrate, wherein the dummy pixel separation capping film extends between the bottom surface of the dummy pixel separation filling film and the first surface of the substrate;
a wiring structure disposed on the first surface of the substrate and including an inter-wiring insulating film and a wiring in the inter-wiring insulating film;
a color filter disposed on the second surface of the substrate;
a pad disposed on the wiring structure and connected to the wiring,
a first connection pattern connected to a lower surface of the pad;
a second connection pattern disposed on a lower surface of the first connection pattern, the second connection pattern connected to the first connection pattern; and
a contact that is directly connected to the dummy pixel separation filling film and connects the dummy pixel separation filling film and the wiring,
wherein a height from the first surface of the substrate to a bottom surface of the pixel separation filling film is greater than a height from the first surface of the substrate to the bottom surface of the dummy pixel separation filling film.

19. The image sensor of claim 18, wherein an upper surface of the pixel separation pattern is positioned on a same plane as an upper surface of the dummy pixel separation pattern.

20. The image sensor of claim 18, wherein:
the pixel separation pattern includes a pixel separation capping film on the pixel separation filling film;
a height of the dummy pixel separation capping film in a vertical direction is less than a height of the pixel separation capping film in the vertical direction.

* * * * *